(12) United States Patent
Yao

(10) Patent No.: US 10,470,322 B2
(45) Date of Patent: Nov. 5, 2019

(54) CARD SOCKET COMPONENT AND ELECTRONIC DEVICE

(71) Applicant: GUANGDONG OPPO MOBILE TELECOMMUNICATIONS CORP., LTD., Dongguan, Guangdong (CN)

(72) Inventor: Kun Yao, Dongguan (CN)

(73) Assignee: GUANGDONG OPPO MOBILE TELECOMMUNICATIONS CORP., LTD., Dongguan, Guangdong (CN)

( * ) Notice: Subject to any disclaimer, the term of this patent is extended or adjusted under 35 U.S.C. 154(b) by 0 days.

(21) Appl. No.: 16/222,440

(22) Filed: Dec. 17, 2018

(65) Prior Publication Data

US 2019/0281714 A1 Sep. 12, 2019

(30) Foreign Application Priority Data

Mar. 7, 2018 (CN) .......................... 2018 1 0185157
Mar. 7, 2018 (CN) ..................... 2018 2 0311491 U

(51) Int. Cl.
  *H05K 5/02* (2006.01)
(52) U.S. Cl.
  CPC ......... *H05K 5/0221* (2013.01); *H05K 5/0295* (2013.01)
(58) Field of Classification Search
  CPC ...... G06F 1/1675; G06F 1/1656; G06F 1/184; G06F 1/185; G06F 1/186; G06F 1/187; H05K 5/0295; H05K 5/0221; H05K 7/1461; H04B 1/3818; H04M 1/02
  See application file for complete search history.

(56) References Cited

U.S. PATENT DOCUMENTS 5,033,972 A * 7/1991 Komatsu .............. G06K 7/0047
                                                           439/153
2013/0260583 A1   10/2013 Takahashi et al.
(Continued)

FOREIGN PATENT DOCUMENTS

CN         202749602 U      2/2013
CN         204349090 U      5/2015
(Continued)

OTHER PUBLICATIONS

International Search Report in the international application No. PCT/CN2018/117032, dated Feb. 26, 2019.
(Continued)

*Primary Examiner* — Hoa C Nguyen
*Assistant Examiner* — Christopher L Augustin
(74) *Attorney, Agent, or Firm* — Ladas & Parry LLP

(57) ABSTRACT

A card socket component for an electronic device includes a housing, a bearing plate fixed in the housing, a card holder, and an elastic component. The housing has a through hole. The card holder has a tray and a baffle connected to the tray. The tray passes through the through hole of the housing, and is slidably connected to the bearing plate. The elastic component includes an elastic member and a lever. The elastic member is elastically disposed on the bearing plate in a sliding direction of the card holder. The lever is rotatably connected to the bearing plate, a first end of the lever abuts against the elastic member, and a second end of the lever is able to abut against the tray. Also provided is an electronic device.

20 Claims, 20 Drawing Sheets

(56) References Cited

U.S. PATENT DOCUMENTS

| | | | |
|---|---|---|---|
| 2013/0309885 A1* | 11/2013 | Liu | H01R 13/629 439/153 |
| 2013/0335896 A1 | 12/2013 | Gao | |
| 2014/0247568 A1* | 9/2014 | Lin | H04B 1/3818 361/754 |
| 2015/0201518 A1* | 7/2015 | Hsu | H05K 7/1461 361/807 |
| 2016/0111802 A1* | 4/2016 | Shimotsu | H01R 12/7076 439/159 |
| 2016/0266619 A1* | 9/2016 | Heiskanen | G06F 1/1656 |
| 2016/0360632 A1* | 12/2016 | Lee | H05K 1/18 |
| 2017/0070002 A1* | 3/2017 | Do | H01R 13/635 |
| 2017/0102742 A1* | 4/2017 | Kim | G06F 1/1656 |
| 2017/0207558 A1* | 7/2017 | Chen | H04B 1/3818 |
| 2017/0207808 A1* | 7/2017 | Park | H04B 1/3818 |
| 2018/0132369 A1* | 5/2018 | Lee | H04B 1/3818 |
| 2018/0183181 A1 | 6/2018 | Kim | |
| 2018/0260588 A1* | 9/2018 | Shafir | G06K 7/00 |

FOREIGN PATENT DOCUMENTS

| | | |
|---|---|---|
| CN | 104868318 A | 8/2015 |
| CN | 104902039 A | 9/2015 |
| CN | 105635368 A | 6/2016 |
| CN | 106331231 A | 1/2017 |
| CN | 108539517 A | 9/2018 |
| CN | 208753636 U | 4/2019 |
| WO | 20162045212 A1 | 12/2018 |

OTHER PUBLICATIONS

First Chinese Office Action with English translation dated Jun. 5, 2019 for Application No. CN 201810185157.4.

European Search Report in the European application No. 18206735.5, dated Jul. 8, 2019.

* cited by examiner

CARD SOCKET COMPONENT AND ELECTRONIC DEVICE

CROSS-REFERENCE TO RELATED APPLICATION

The present application claims benefit of Chinese Patent Application No. 201820311491.5, filed on Mar. 7, 2018, and of Chinese Patent Application No. 201810185157.4, filed on Mar. 7, 2018, the contents of which are hereby incorporated by reference in their entirety.

TECHNICAL FIELD

The present disclosure relates to the field of terminal equipment, and more particularly to a card socket component and an electronic device.

BACKGROUND

The existing mobile phone includes a card holder for carrying an information card, and a tray in the card holder is usually engaged to the interior of housing to lock the card holder onto the housing. When it is necessary to take out the information card, a push pin is required to separate the tray from an internal structure of the housing by so as to push the card holder out of the housing, and then information card in the card holder cloud be taken out. The operation is inconvenient.

SUMMARY

The present disclosure provides a card socket component that facilitates taking-out of the card and an electronic device.

An embodiment of the present disclosure provides a card socket component for an electronic device. The card socket component may include a housing, a bearing plate fixed in the housing, a card holder, and an elastic component. The housing has a through hole. The card holder has a tray and a baffle connected to the tray. The tray passes through the through hole of the housing. The tray is slidably connected to the bearing plate. The elastic component may include an elastic member and a lever. The elastic member is elastically disposed on the bearing plate in a sliding direction of the card holder, and the lever is rotatably connected to the bearing plate. A first end of the lever abuts against the elastic member, and a second end of the lever may abut against the tray. When the baffle of the card holder is locked onto the housing, the second end of the lever provides an opposite elastic force for the card holder. After the baffle is poked by an external force, the baffle is unlocked from the housing and is pushed out from the housing under the action of the second end of the lever.

In another aspect, an embodiment of the present disclosure also provides an electronic device, including a motherboard and a card socket component. The card socket component may include a housing, a bearing plate fixed in the housing, a card holder, and an elastic component. The housing has a through hole. The card holder has a tray and a baffle connected to the tray. The tray passes through the through hole of the housing. The tray is slidably connected to the bearing plate. The elastic component may include an elastic member and a lever. The elastic member is elastically disposed on the bearing plate in a sliding direction of the card holder, and the lever is rotatably connected to the bearing plate. A first end of the lever abuts against the elastic member, and a second end of the lever may abut against the tray. When the baffle of the card holder is locked onto the housing, the second end of the lever provides an opposite elastic force for the card holder. After the baffle is poked by an external force, the baffle is unlocked from the housing and is pushed out from the housing under the action of the second end of the lever. The bearing plate is electrically connected to the motherboard.

In yet another aspect, an embodiment of the present disclosure also provides an electronic device, including a motherboard and a card socket component. The card socket component may include a housing having a through hole, a bearing plate fixed in the housing and electrically connected to the motherboard, a card holder having a tray and a baffle connected to the tray and an elastic component including an elastic member and a lever. The tray passes through the through hole of the housing and being slidably connected to the bearing plate. The lever is rotatably connected to the bearing plate. A first end of the lever abuts against the elastic member, and a second end of the lever abuts against the tray. The second end of the lever always provides an opposite elastic force for the card holder under the action of the elastic member. The card socket component has a locking position in which the baffle of the card holder is locked onto the housing, and a unlocking position in which the baffle is unlocked from the housing and is pushed out from the housing under the action of the second end of the lever.

According to the card socket component and the electronic device provided by the embodiment of the present disclosure, a baffle of a card holder is locked onto a housing, and the baffle cloud be unlocked from the housing by poking the baffle. Moreover, the second end of a lever always provides an elastic force for pushing the card holder out from the housing, such that the baffle will be pushed out by the second end of the lever when the baffle and the housing are in an unlocking state, so as to provide a card socket component and an electronic device that facilitate the taking-out of the card.

BRIEF DESCRIPTION OF DRAWINGS

In order to describe the technical solutions in the present disclosure more clearly, the drawings required to be used in the embodiment will be simply introduced below. It is apparent the drawings in the following descriptions are only some embodiments of the present disclosure. Those of ordinary skilled in the art may further obtain other drawings according to these drawings without creative work.

DETAILED DESCRIPTION

Figure 1:
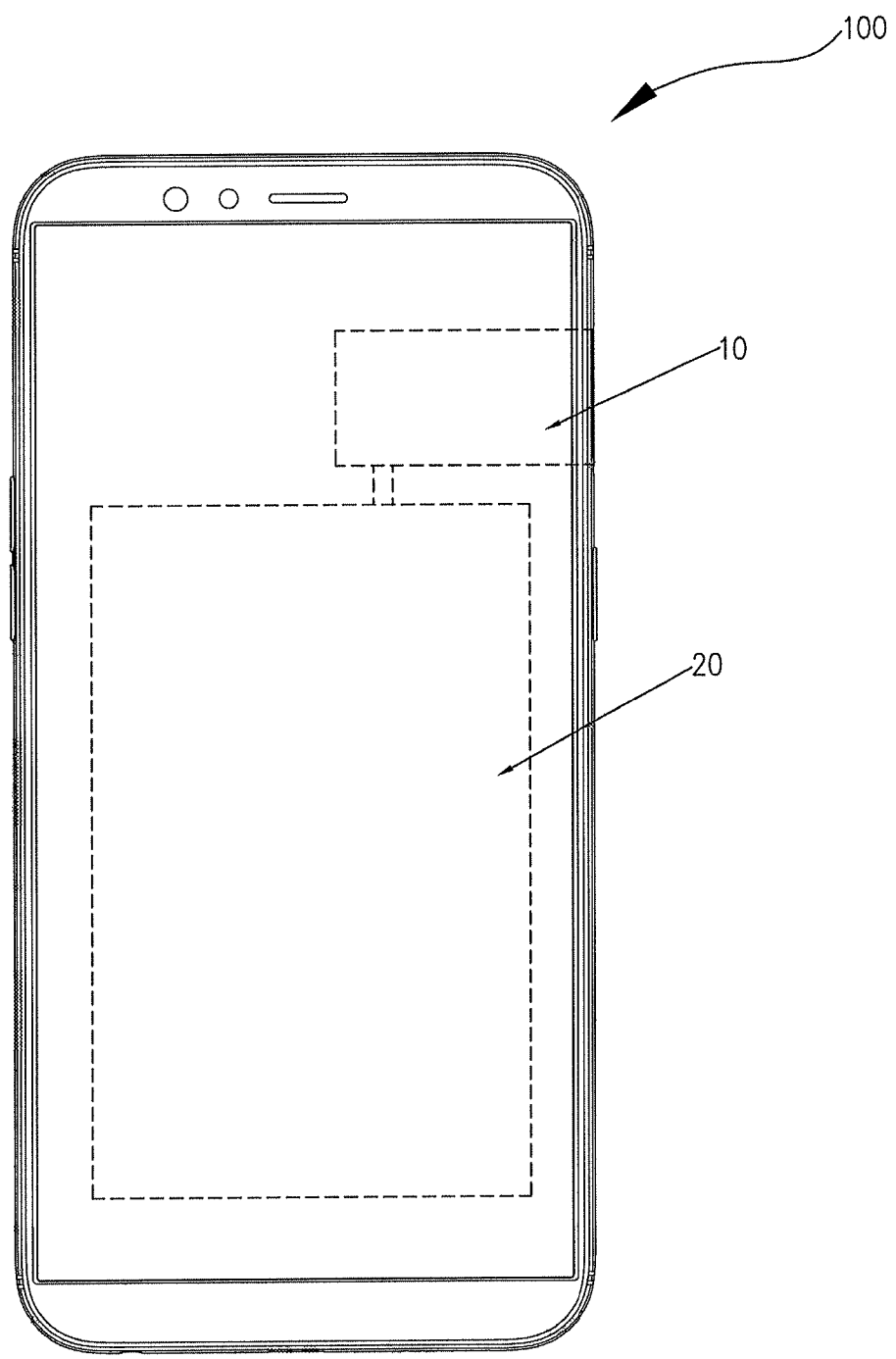
FIG. 1 illustrates a schematic diagram of an electronic device according to an embodiment of the present disclosure.

An embodiment of the present disclosure provides a card socket component for an electronic device. The card socket component may include a housing, a bearing plate fixed in the housing, a card holder, and an elastic component. The housing has a through hole. The card holder has a tray and a baffle connected to the tray. The tray passes through the through hole of the housing. The tray is slidably connected to the bearing plate. The elastic component may include an elastic member and a lever. The elastic member is elastically disposed on the bearing plate in a sliding direction of the card holder, and the lever is rotatably connected to the bearing plate. A first end of the lever abuts against the elastic member, and a second end of the lever may abut against the tray. When the baffle of the card holder is locked onto the housing, the second end of the lever provides an opposite elastic force for the card holder. After the baffle is poked by an external force, the baffle is unlocked from the housing and is pushed out from the housing under the action of the second end of the lever.

In at least one embodiment, the card socket component is formed with a receiving portion having a closed end, an open end, and a cavity communicated with the open end. The closed end and the open end are disposed opposite to one another. One end of the elastic member is fixedly disposed on the closed end, the other end of the elastic member extends towards the open end. The first end of the lever extends into the open end and abuts against the other end of the elastic member.

In at least one embodiment, the edge of the bearing plate is bent to form the receiving portion.

In at least one embodiment, the card socket component further includes a cover which is mounted on the bearing plate and defines a receiving space with the bearing plate. The receiving space directly faces the through hole. The card holder is slidably disposed in the receiving space. The elastic component is located in the receiving space. The edge of the cover is bent to form the receiving portion.

In at least one embodiment, the receiving portion has a side edge and a bottom edge adjacent to each other. The length of the side edge extends in the sliding direction of the card holder. The bottom edge forms the closed end of the receiving portion. The elastic member is elastically connected between the bottom edge and the first end of the lever.

In at least one embodiment, the receiving portion also has a flange. The flange and the side edge are disposed opposite to one another. The first end of the lever is movable between the flange and the side edge.

In at least one embodiment, the bearing plate also has an extending portion. one end of the extending portion is connected to the side edge in a bending manner and the other end of the extending portion extends towards the bearing plate, such that the extending portion and the side edge form a space surrounding the elastic member.

In at least one embodiment, the cover also has an elastic portion. The end of the elastic portion extends towards the second end of the lever and is able to abut against the second end of the lever.

In at least one embodiment, the elastic portion has a first elastic segment and a second elastic segment connected in sequence. The first elastic segment is disposed at the edge of the cover. The second elastic segment has a bending portion which protrudes towards the second end of the lever and abuts against the second end of the lever.

In at least one embodiment, the first end of the lever has a first surface and a second surface adjacent to each other. The first surface abuts against the elastic member, and the second surface faces towards a periphery face of the elastic member.

In at least one embodiment, the first surface of the lever is further provided with a positioning protrusion protruding from the first surface. The elastic member is mounted around the positioning protrusion.

In at least one embodiment, a torque from the first end of the lever to a rotary shaft of the lever is smaller than a torque from the second end of the lever to the rotary shaft of the lever.

In at least one embodiment, a hole wall of the through hole is provided with a protrusion. The baffle is slidably connected to the tray. A side surface of the baffle is provided with a groove. The baffle is slidably disposed in the through hole in a radial direction of the through hole. When the baffle slides to an extent that the protrusion is engaged into the groove of the baffle, the baffle is locked onto the housing and is located at a first staying position with respect to the tray. When the baffle slides to an extent that the protrusion is separated from the groove of the baffle, the baffle is pushed out from the housing under the action of the elastic force of the lever and is located at a second staying position with respect to the tray.

In at least one embodiment, the tray includes a tray body and a first sliding plate fixed to the tray body. The tray body is configured to carry an information card. The baffle includes a baffle body, and a second sliding plate and a third sliding plate which are fixedly connected to the baffle body. The second sliding plate and the third sliding plate are slidably connected to two opposite sides of the first sliding plate so as to slidably connect the baffle to the tray in the radial direction of the through hole.

In at least one embodiment, the card socket component further includes a pin, The first sliding plate is provided with a strip-shaped groove extending in the radial direction of the through hole. The second sliding plate is provided with a first through hole. The pin includes a first portion and a second portion fixedly connected to the first portion. The first portion is located in the first through hole so as to be fixed with respect to the second sliding plate. The second portion is located in the strip-shaped groove so as to be slidably connected to the first sliding plate.

In at least one embodiment, the third sliding plate is provided with a second through hole coaxial with the first through hole. The pin further includes a third portion connected to a side of the second portion away from the first portion and located in the second through hole.

In at least one embodiment, the hole wall of the through hole is provided with a locking slot. The baffle includes a baffle body and at least one locking member rotatably connected to the baffle body. The baffle body is connected to the tray and has at least one locking hole. The locking member is received in the locking hole of the baffle body. The locking member has a limiting protrusion. When the locking member rotates to locate the limiting protrusion of the locking member in the locking slot, the baffle body is locked onto the housing. When the locking member rotates to make the limiting protrusion of the locking member separated from the locking slot, the baffle body is pushed out from the housing under the action of the elastic force of the lever.

In at least one embodiment, the locking member includes a rotary pin and a lock piece. The rotary pin is located in the locking hole of the baffle body and extends out of the baffle body. The lock piece is mounted around the rotary pin in such a way that the lock piece forms the limiting protrusion of the locking member.

In at least one embodiment, an end of the rotary pin is flush with an outer surface of the baffle body.

In another aspect, an embodiment of the present disclosure also provides an electronic device, including a motherboard and a card socket component. The card socket component may include a housing, a bearing plate fixed in the housing, a card holder, and an elastic component. The housing has a through hole. The card holder has a tray and a baffle connected to the tray. The tray passes through the through hole of the housing. The tray is slidably connected to the bearing plate. The elastic component may include an elastic member and a lever. The elastic member is elastically disposed on the bearing plate in a sliding direction of the card holder, and the lever is rotatably connected to the bearing plate. A first end of the lever abuts against the elastic member, and a second end of the lever may abut against the tray. When the baffle of the card holder is locked onto the housing, the second end of the lever provides an opposite elastic force for the card holder. After the baffle is poked by an external force, the baffle is unlocked from the housing and is pushed out from the housing under the action of the second end of the lever. The bearing plate is electrically connected to the motherboard.

In at least one embodiment, the card socket component is formed with a receiving portion having a closed end, an open end, and a cavity communicated with the open end. The closed end and the open end are disposed opposite to one another. One end of the elastic member is fixedly disposed on the closed end, the other end of the elastic member extends towards the open end. The first end of the lever extends into the open end and abuts against the other end of the elastic member.

In at least one embodiment, the edge of the bearing plate is bent to form the receiving portion.

In at least one embodiment, the card socket component further includes a cover which is mounted on the bearing plate and defines a receiving space with the bearing plate. The receiving space directly faces the through hole. The card holder is slidably disposed in the receiving space. The elastic component is located in the receiving space. The edge of the cover is bent to form the receiving portion.

In at least one embodiment, the receiving portion has a side edge and a bottom edge adjacent to each other. The length of the side edge extends in the sliding direction of the card holder. The bottom edge forms the closed end of the receiving portion. The elastic member is elastically connected between the bottom edge and the first end of the lever.

In at least one embodiment, the receiving portion also has a flange. The flange and the side edge are disposed opposite to one another. The first end of the lever is movable between the flange and the side edge.

In at least one embodiment, the bearing plate also has an extending portion. one end of the extending portion is connected to the side edge in a bending manner and the other end of the extending portion extends towards the bearing plate, such that the extending portion and the side edge form a space surrounding the elastic member.

In at least one embodiment, the cover also has an elastic portion. The end of the elastic portion extends towards the second end of the lever and is able to abut against the second end of the lever.

In at least one embodiment, the elastic portion has a first elastic segment and a second elastic segment connected in sequence. The first elastic segment is disposed at the edge of the cover. The second elastic segment has a bending portion which protrudes towards the second end of the lever and abuts against the second end of the lever.

In at least one embodiment, the first end of the lever has a first surface and a second surface adjacent to each other. The first surface abuts against the elastic member, and the second surface faces towards a periphery face of the elastic member.

In at least one embodiment, the first surface of the lever is further provided with a positioning protrusion protruding from the first surface. The elastic member is mounted around the positioning protrusion.

In at least one embodiment, a torque from the first end of the lever to a rotary shaft of the lever is smaller than a torque from the second end of the lever to the rotary shaft of the lever.

In at least one embodiment, a hole wall of the through hole is provided with a protrusion. The baffle is slidably connected to the tray. A side surface of the baffle is provided with a groove. The baffle is slidably disposed in the through hole in a radial direction of the through hole. When the baffle slides to an extent that the protrusion is engaged into the groove of the baffle, the baffle is locked onto the housing and is located at a first staying position with respect to the tray. When the baffle slides to an extent that the protrusion is separated from the groove of the baffle, the baffle is pushed out from the housing under the action of the elastic force of the lever and is located at a second staying position with respect to the tray.

In at least one embodiment, the tray includes a tray body and a first sliding plate fixed to the tray body. The tray body is configured to carry an information card. The baffle includes a baffle body, and a second sliding plate and a third sliding plate which are fixedly connected to the baffle body. The second sliding plate and the third sliding plate are slidably connected to two opposite sides of the first sliding plate so as to slidably connect the baffle to the tray in the radial direction of the through hole.

In at least one embodiment, the card socket component further includes a pin, The first sliding plate is provided with a strip-shaped groove extending in the radial direction of the through hole. The second sliding plate is provided with a first through hole. The pin includes a first portion and a second portion fixedly connected to the first portion. The first portion is located in the first through hole so as to be fixed with respect to the second sliding plate. The second portion is located in the strip-shaped groove so as to be slidably connected to the first sliding plate.

In at least one embodiment, the third sliding plate is provided with a second through hole coaxial with the first through hole. The pin further includes a third portion connected to a side of the second portion away from the first portion and located in the second through hole.

In at least one embodiment, the hole wall of the through hole is provided with a locking slot. The baffle includes a baffle body and at least one locking member rotatably connected to the baffle body. The baffle body is connected to the tray and has at least one locking hole. The locking member is received in the locking hole of the baffle body. The locking member has a limiting protrusion. When the locking member rotates to locate the limiting protrusion of the locking member in the locking slot, the baffle body is locked onto the housing. When the locking member rotates to make the limiting protrusion of the locking member separated from the locking slot, the baffle body is pushed out from the housing under the action of the elastic force of the lever.

In at least one embodiment, the locking member includes a rotary pin and a lock piece. The rotary pin is located in the locking hole of the baffle body and extends out of the baffle body. The lock piece is mounted around the rotary pin in such a way that the lock piece forms the limiting protrusion of the locking member.

In at least one embodiment, an end of the rotary pin is flush with an outer surface of the baffle body.

In yet another aspect, an embodiment of the present disclosure also provides an electronic device, including a motherboard and a card socket component. The card socket component may include a housing having a through hole, a bearing plate fixed in the housing and electrically connected to the motherboard, a card holder having a tray and a baffle connected to the tray and an elastic component including an elastic member and a lever. The tray passes through the through hole of the housing and being slidably connected to the bearing plate. The lever is rotatably connected to the bearing plate. A first end of the lever abuts against the elastic member, and a second end of the lever abuts against the tray. The second end of the lever always provides an opposite elastic force for the card holder under the action of the elastic member. The card socket component has a locking position in which the baffle of the card holder is locked onto the housing, and a unlocking position in which the baffle is unlocked from the housing and is pushed out from the housing under the action of the second end of the lever.

In at least one embodiment, a hole wall of the through hole is provided with a locking slot. The baffle includes a baffle body and at least one locking member rotatably connected to the baffle body. The baffle body is connected to the tray and has at least one locking hole. The locking member is received in the locking hole of the baffle body. The locking member has a limiting protrusion. In the locking position, the limiting protrusion of the locking member is located in the locking slot to lock the baffle body onto the housing. In the unlocking position, the limiting protrusion of the locking member is separated from the locking slot to unlock the baffle body from the housing.

The technical solutions in the embodiments of the present disclosure are clearly and completely described in the following with reference to the accompanying drawings in the embodiment of the present disclosure.

In order to more clearly understand the objectives, features and advantages of the present disclosure, the present disclosure will be described in detail below with reference to the drawings and specific embodiments. It is to be noted that the embodiments of the present disclosure and the features in the embodiments may be combined with each other without conflict.

Many details are elaborated in the following description in order to fully understand the present disclosure. The described embodiments are only some of the embodiments of the present disclosure, not all of the embodiments. All other embodiments obtained by those skilled in the art based on the embodiments of the present disclosure without creative efforts fall within the scope of protection of the present disclosure.

In addition, the following explanation of each embodiment refers to illustration of an implementable specific embodiment of the present disclosure with reference to additional drawings. The direction terms mentioned in the present disclosure, such as "length", "width", "X direction", and "Y direction", are only the directions with reference to the additional drawings. Therefore, the used direction terms are intended to better and more clearly illustrate and understand the present disclosure instead of indicating or implying that the device or element must have a specific orientation or must be constructed and operated in a specific orientation, and thus cannot be interpreted as limitation to the present disclosure. Unless otherwise specified and limited, terms "mounting", "mutual connection" and "connection" should be generally understood. For example, the term may be fixed connection or detachable connection or integral connection, the term may be mechanical connection, and the term may be direct connection or indirect connection through an intermediate or communication inside two elements. Those of ordinary skill in the art can understand specific implications of the above terms in the present disclosure in specific situations.

FIG. 1 illustrates an electronic device 100 provided by an embodiment of the present disclosure. The electronic device 100 may be a tablet computer, a mobile phone, a wearable device or the like. The electronic device 100 includes a motherboard 20 and a card socket component 10. The motherboard 20 is electrically connected to the card socket component 10 for data transmission with the card socket component 10. For example, information of an information card or a memory card mounted in the card socket component 10 is read by the motherboard.

It should be understood that the information card carried by the card socket component 10 includes, but is not limited to, a Subscriber Identification Module (SIM) and a Secure Digital Memory Card (SD).

Figure 2:
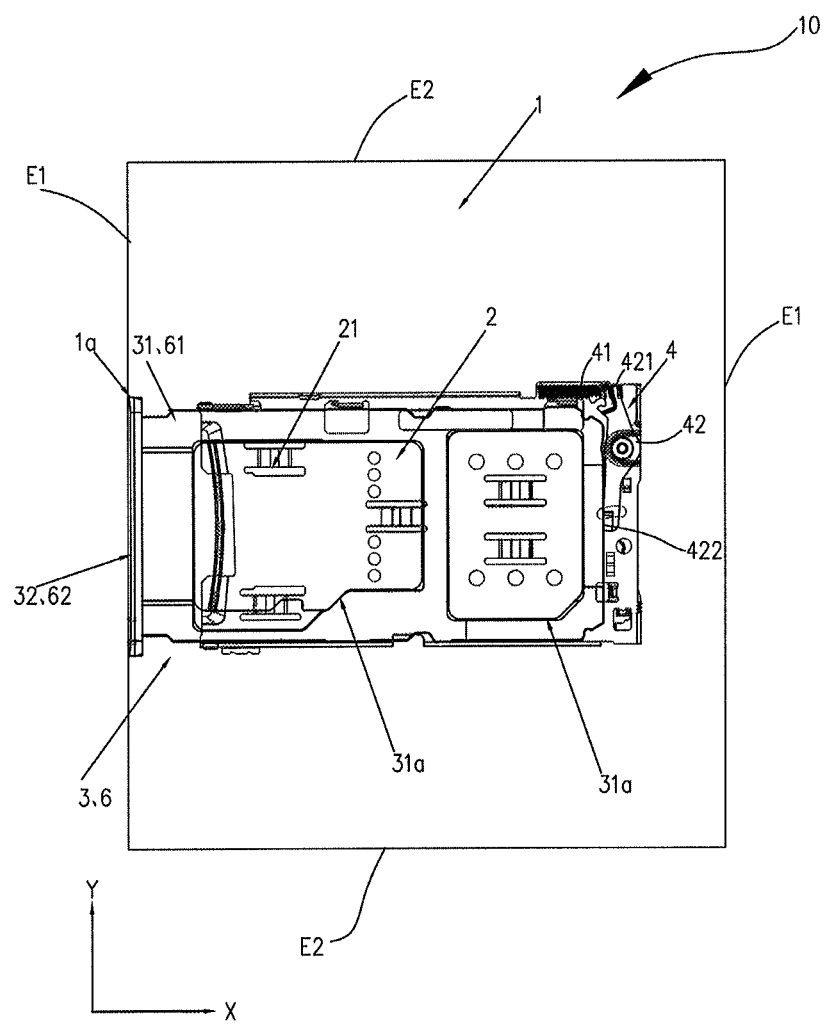
FIG. 2 illustrates a schematic diagram of a card socket component in a locking state in FIG. 1.

FIG. 2 illustrates a card socket component 10 provided by the embodiment of the present disclosure. The card socket component 10 includes a housing 1, a bearing plate 2 fixed in the housing 1, a card holder 3, 6, and an elastic component 4. The housing 1 has a through hole 1a. The card holder 3, 6 has a tray 31, 61 and a baffle 32, 62 connected to the tray 31, 61. The tray 31, 61 is inserted in the through hole 1a of the housing 1, and the tray 31, 61 is slidably connected to the bearing plate 2. The elastic component 4 includes an elastic member 41 and a lever 42. The elastic member 41 is elastically disposed on the bearing plate 2 in a sliding direction of the card holder 3, 6, and the lever 42 is rotatably connected to the bearing plate 2. A first end 421 of the lever 42 abuts against the elastic member 41, and a second end 422 of the lever 42 may abuts against the tray 31, 61.

FIG. 2 illustrates the card socket component 10 in a locking position. In the locking position of the card socket component 10, the second end 422 of the lever 42 provides an opposite elastic force for the card holder 3, 6 when the baffle 32, 62 of the card holder 3, 6 is locked onto the housing 1.

Figure 3:
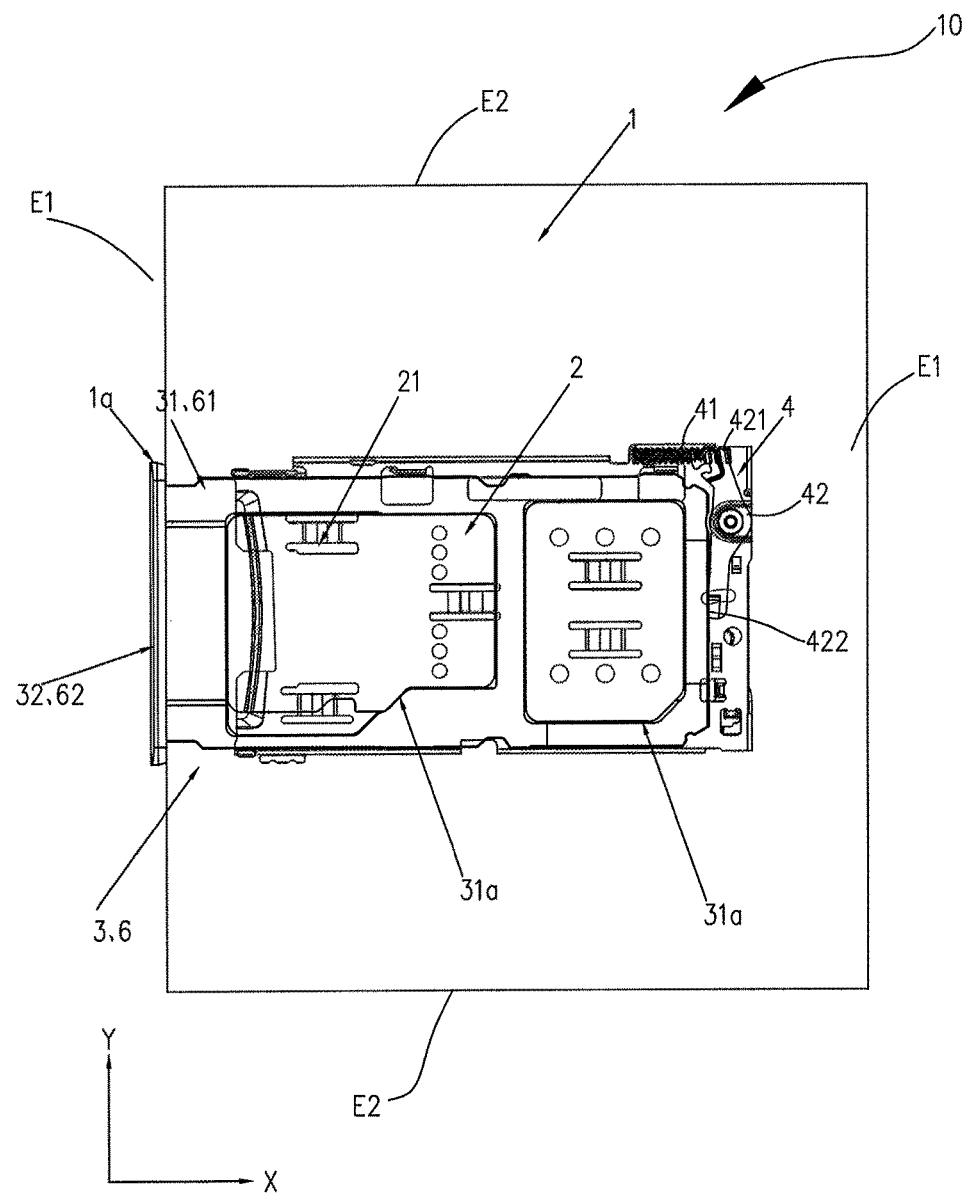
FIG. 3 illustrates a schematic diagram of a card socket component in an unlocking state in FIG. 1.

FIG. 3 illustrates the card socket component 10 in an unlocking position. In the unlocking position of the card socket component 10, after the baffle 32, 62 is poked by an external force, the baffle 32, 62 is unlocked from the housing 1, and the baffle 32, 62 is pushed out from the housing 1 under the action of the second end 422 of the lever 42.

As illustrated in FIG. 1 and FIG. 2, the housing 1 may be a middle frame of the electronic device 100. The housing 1 has two long edges E1 and two short edges E2 connected between the two long edges E1. The through hole 1a is provided on one of the long edge E1 of the housing 1. The through hole 1a is strip-shaped, and extends in a length extending direction of the long edge E1 of the housing 1. Of course, in other embodiments, the housing 1 may include a middle frame and a rear cover connected to the middle frame integrally.

For ease of description, a length extending direction of the short edge E2 of the housing 1 is defined as an X direction, and the length extending direction of the long edge E1 of the housing 1 is defined as a Y direction.

Figure 4:
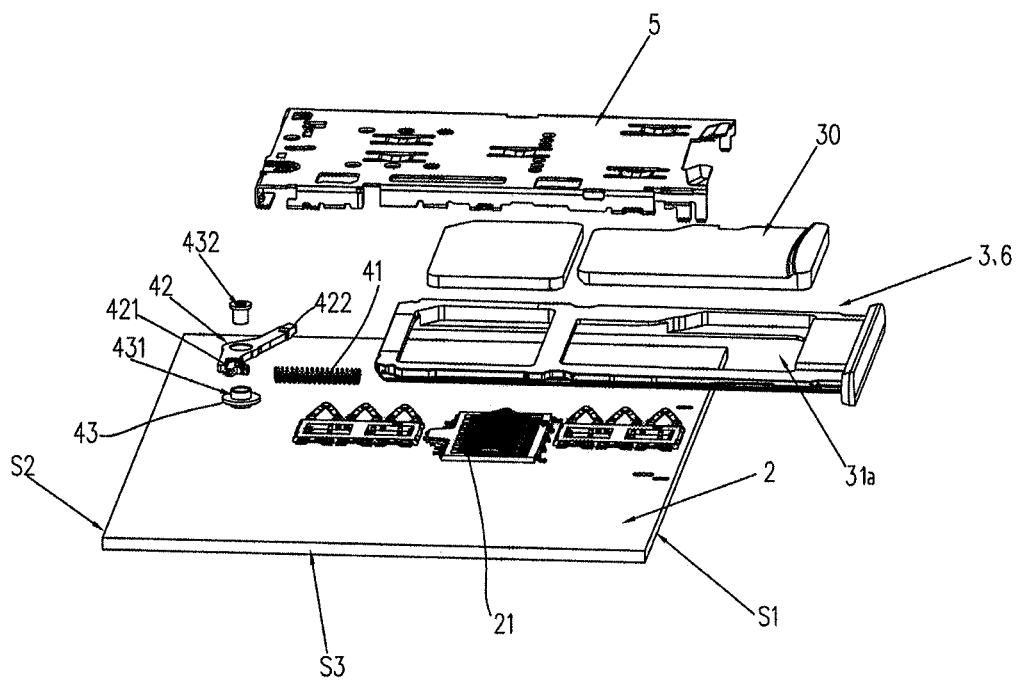
FIG. 4 illustrates an exploded view of a card socket component in FIG. 1.

As illustrated in FIG. 2 and FIG. 4, the bearing plate 2 may be a circuit board, and the bearing plate 2 is provided with multiple elastic pieces 21 for electrically connecting to the information card so as to read data on the information card and transmit the data to the motherboard 20. The bearing plate 2 is fixed inside the housing 1. The bearing plate 2 is substantially rectangular, and has a first carrying edge S1, a second carrying edge S2, and two third carrying edges S3 connected between the first carrying edge S1 and the second carrying edge S2. The first carrying edge and the second carrying edge is disposed oppositely.

As illustrated in FIG. 2, the elastic member 41 in the elastic component 4 is elastically connected to the bearing plate 2. The elastic member 41 has a first elastic end and a second elastic end disposed oppositely in an elastic expansion direction. When the elastic member 41 is elastically connected to the bearing plate 2, the elastic expansion direction of the elastic member 41 is substantially parallel to the length extending direction of the third carrying edge S3 of the bearing plate 2, namely the X direction.

In the present embodiment, as illustrated in FIG. 2, the elastic member 41 is a spring. Of course, in other embodiments, the elastic member 41 may also be silica gel, foam or rubber. As illustrated in FIG. 2, the lever 42 in the elastic component 4 is rotatably connected to the bearing plate 2 through a pin component 43.

As illustrated in FIG. 4, it should be understood that the pin component 43 includes a first fixing pin 431 and a second fixing pin 432. The first fixing pin 431 is fixed to the bearing plate 2, the lever 42 passes through the first fixing pin 431, and the second fixing pin 432 passes through the lever 42 and is fixed to the first fixing pin 431, so that the lever 42 is rotatably connected to the bearing plate 2.

In the present embodiment, the first fixing pin 431 is near corners of the bearing plate 2, so as to avoid from interfering with the sliding of the card holder 3, 6, thereby ensuring that the space on the bearing plate 2 is large enough for the sliding of the card holder 3, 6, and improving the reliability of the card socket component 10.

In the present embodiment, as illustrated in FIG. 2 to FIG. 4, the lever 42 is substantially V-shaped. After the lever 42 is rotatably connected to the bearing plate 2, the first end 421 of the lever 42 abuts against the second elastic end of the elastic member 41, and the second end 422 of the lever 42 faces the card holder 3, 6. The second end 422 of the lever 42 cloud be in contact with the card holder 3, 6 and rotates along with the sliding of the card holder 3, 6, so that the first end 421 connected to the second end 422 continuously compresses the elastic member 41 to bring the elastic member 41 to a compressed state. Correspondingly, in a state where the card holder 3, 6 is unlocked from the housing 1, due to a restoring force for restoring the deformation of the elastic member, the elastic member 41 pushes the first end 421, and the first end 421 rotates under the pushing of the elastic member 41, so that the second end 422 connected to the first end 421 exerts a force on the card holder 3, 6 abutted against the second end, to push the card holder 3, 6 out from the housing 1. After the card holder 3, 6 is pushed out from the housing 1, a user may take out the card holder 3, 6, and the card cloud be taken out from the card socket component 10.

Figure 5:
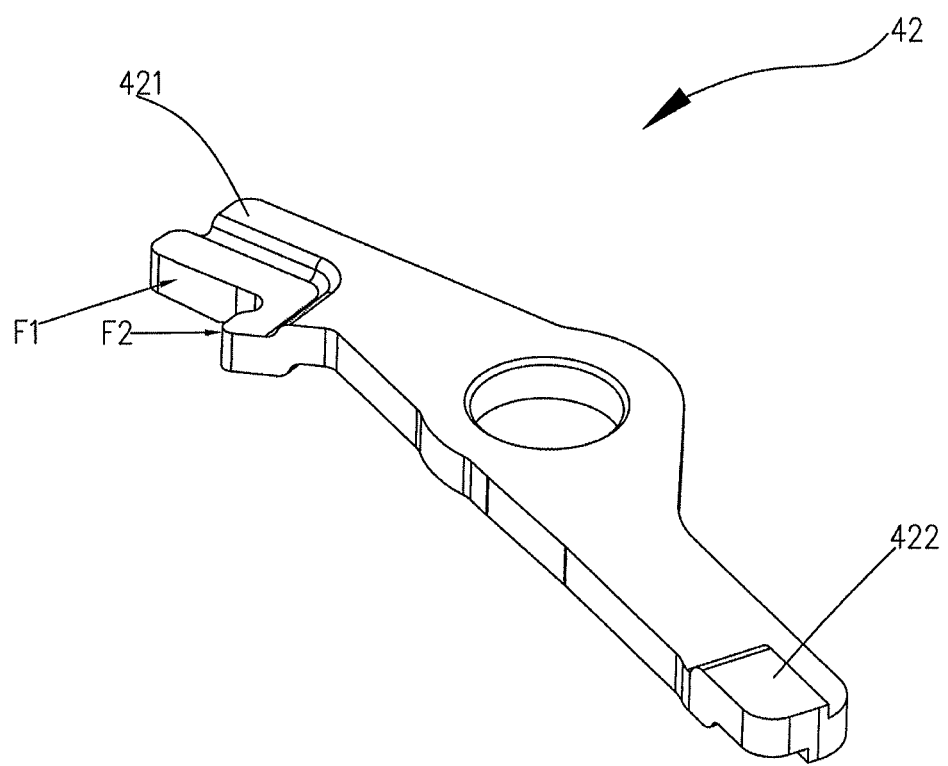
FIG. 5 illustrates a schematic diagram of a lever of a card socket component in FIG. 4.

As illustrated in FIG. 5, it should be understood that the first end 421 of the lever 42 has a first surface F1 and a second surface F2 adjacent to each other, the first surface F1 abuts against the elastic member 41, and the second surface F2 faces a periphery of the elastic member 41.

Figure 6:
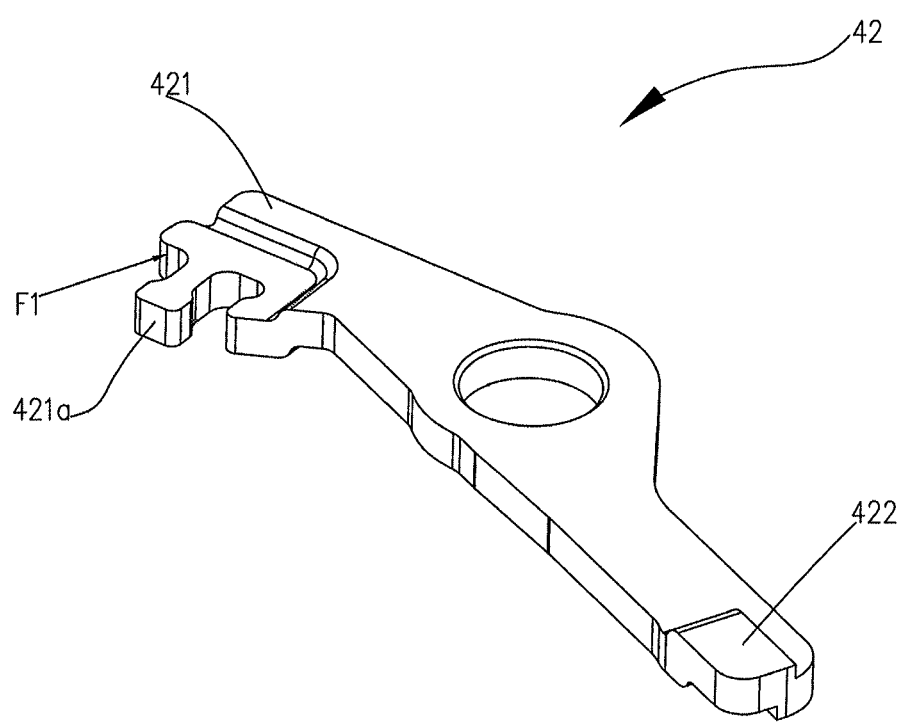
FIG. 6 illustrates a schematic diagram of another lever of a card socket component in FIG. 4.

Further, as illustrated in FIG. 6, the first surface F1 of the lever 42 may be provided with a positioning protrusion 421a protruding from the first surface of the lever, and the elastic member 41 is mounted around the positioning protrusion 421a. The first end 421 of the lever 42 is formed with a U-shaped gap to form two support arms, one of which is clamped into the second elastic end 41b of the elastic member 41, thereby ensuring that the first end 421 of the lever 42 always abuts against the second elastic end 41b of the elastic member 41, preventing the two ends from separating, and improving the reliability of the card socket component 10. Of course, in other embodiments, the first end 421 of the lever 42 may also be L-shaped, that is, the lever 42 has only one support arm. The surface of the support arm of the lever 42 abuts against the second elastic end 41b of the elastic member 41.

As illustrated in FIG. 2, it should be understood that a torque from the first end 421 of the lever 42 to a rotary shaft of the lever 42 is smaller than a torque from the second end 422 of the lever 42 to the rotary shaft of the lever 42. The torque of the lever 42 is designed as the structure as above, so that the elastic force of the lever 42 transferred from the first end 421 to the second end 422 is larger, and thus the card holder 3, 6 cloud be effectively pushed out from the housing 1. Of course, in other embodiments, the torque from the first end 421 of the lever 42 to the rotary shaft of the lever 42 may also be equal to or greater than the torque from the second end 422 of the lever 42 to the rotary shaft of the lever 42.

As illustrated in FIG. 2, the card holder 3, 6 slides into the housing 1 via the through hole 1a of the housing 1, and the information card on the card holder 3, 6 cloud be electrically connected with the bearing plate 2. The relationship between the card holder 3, 6 and the bearing plate 2 during the sliding process is that: when the card holder 3, 6 slides into the housing 1 via the through hole 1a, the tray 31, 61 slides beyond the first carrying edge S1, and gradually approach the second carrying edge S2.

As illustrated in FIG. 2, the relationship between the card holder 3, 6 and the bearing plate 2 after sliding is that: the tray 31, 61 is substantially parallel to the bearing plate 2, and the information card loaded on the tray 31, 61 cloud be in contact with the elastic piece 21 on the bearing plate 2.

As illustrated in FIG. 4, the tray 31, 61 has at least one card positioner 31a for carrying at least one information card. The card positioners 31a are spaced from each other. It should be understood that the tray 31, 61 has two card positioners 31a disposed side by side in the sliding direction of the tray 31, 61, namely, the X direction of the electronic device 100. One of the card positioners 31a is configured to load a SIM card, and the other card positioner 31a is configured to load loading an SD card.

As illustrated in FIG. 2 and FIG. 3, the tray 31, 61 is connected to the baffle 32, 62. When the tray 31, 61 is inserted into the housing 1 via the through hole 1a and the tray 31, 61 is totally accommodated in the housing 1, the baffle 32, 62 is locked onto the housing 1. During the tray 31, 61 slides to cause a blocking piece to be locked onto the housing 1, the tray 31, 61 gradually presses against the second end 422 of the lever 42, and thus the second end 422 of the lever 42 rotates along with the sliding of the card holder 3, 6, so that the first end 421 connected to the second end 422 continuously compresses the elastic member 41 to bring the elastic member 41 to a compressed state, thereby exerting an opposite elastic force of the first end 421 on the tray 31, 61.

As illustrated in FIG. 2, it should be understood that the outer surface of the baffle 32, 62 and the outer surface of the housing 1 are coplanar, so as to improve the smoothness of the outer surface of the housing 1.

The baffle 32, 62 of the card holder 3, 6 is locked onto the housing 1, and the baffle 32, 62 cloud be unlocked from the housing 1 by poking the baffle 32, 62. Moreover, the second end 422 of the lever 42 always provides an elastic force for pushing out the card holder 3, 6 from the housing 1, such that when the baffle 32, 62 and the housing 1 are in an unlocking state, the baffle 32, 62 will be pushed out by the second end 422 of the lever 42, so as to provide a card socket component 10 and an electronic device 100 that facilitate the taking-out of the card.

Figure 7:
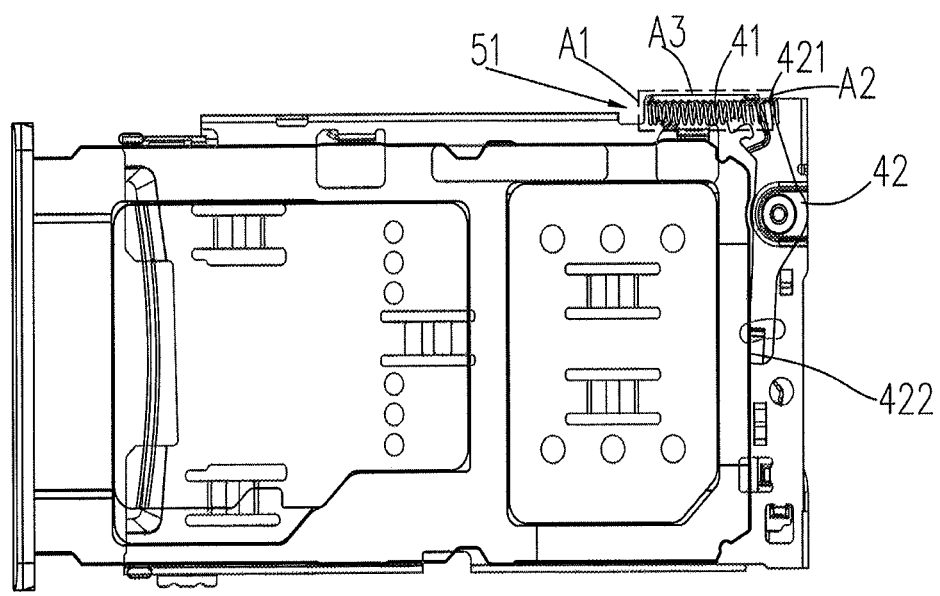
FIG. 7 illustrates a schematic diagram of a receiving portion of a card socket component in FIG. 3.

Further, as illustrated in FIG. 7, a receiving portion 51 is formed in the card socket component 10. The receiving portion 51 has a closed end A1, an open end A2, and a cavity A3 communicated with the open end A2, the closed end and the open end are disposed opposite to one another. One end of the elastic member 41 is fixedly disposed on the closed end A1, and the other end of the elastic member 41 extends towards the open end A2; and the first end 421 of the lever 42 extends into the open end A2 and abuts against the other end of the elastic member 41.

In the present embodiment, the receiving portion 51 is formed in the card socket component 10, so that the elastic member 41 cloud be better fixed in the receiving portion 51. The elastic member 41 could be in a compressed state under the pressing action of the closed end A1 and the first end 421 of the lever 42, and the elastic member 41 could better provide an opposite elastic force for the tray 31, 61.

The receiving portion 51 may be formed on the cover 5, specifically as follows.

Figure 8:
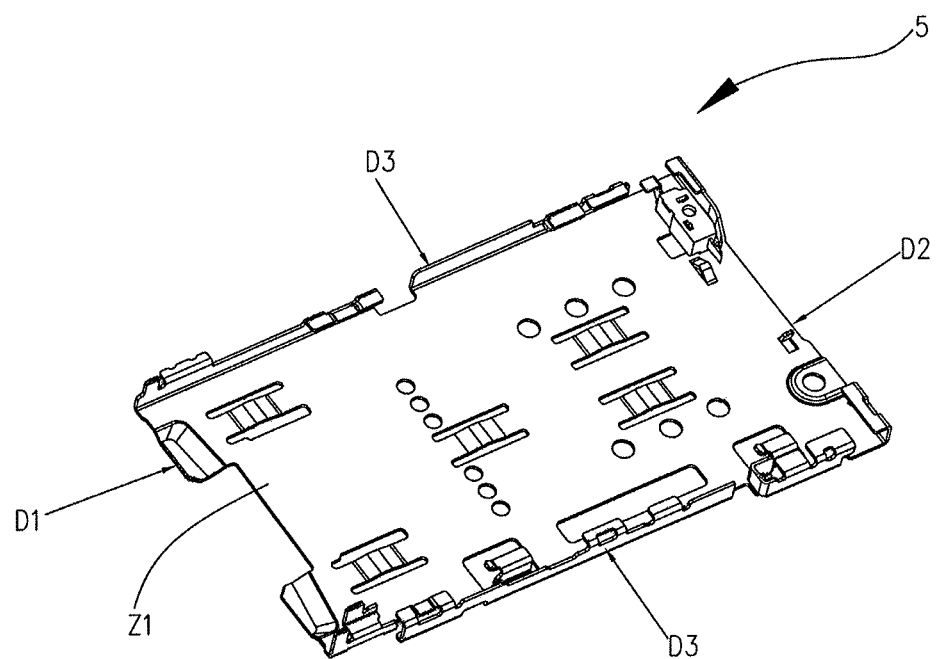
FIG. 8 illustrates a schematic diagram of a cover of a card socket component in FIG. 7.

Further, as illustrated in FIG. 2, FIG. 4 and FIG. 8, the card socket component 10 further includes a cover 5, the cover 5 is mounted on the bearing plate 2 and cooperatively defines a receiving space Z1 with the bearing plate 2. The receiving space Z1 directly faces the through hole 1a, the card holder 3, 6 is slidably disposed in the receiving space Z1, and the elastic component 4 is located in the receiving space Z1.

In the present embodiment, as illustrated in FIG. 2 and FIG. 7, the cover 5 is substantially rectangular, four side edges of which are correspondingly bent to mounted above the bearing plate 2. The receiving space Z1 is bound by the cover 5 and the bearing plate 2. An opening of the receiving space Z1 directly faces the through hole 1a, so that, after the card holder 3, 6 slides into the housing 1 via the through hole 1a, the tray 31, 61 could be inserted into the receiving space Z1. Under the interaction of the cover 5 and the bearing plate 2, the information card carried on the tray 31, 61 cloud be in tight contact with the elastic piece 21 on the bearing plate 2 to make it convenient for the bearing plate 2 to read data of the information card. The cover 5 is provided to form the receiving space Z1 with the bearing plate 2 to make it convenient for the bearing plate 2 to read data of the information card, thereby improving the reliability of the card socket component 10. Of course, in other embodiments, the information card in the card socket component 10 cloud be in tight contact with the elastic piece 21 on the bearing plate 2, without providing the cover 5.

As illustrated in FIG. 7, the cover 5 has a first cover edge D1, a second cover edge D2, and two third cover edges D3 connected between the first cover edge D1 and the second cover edge D2. The first cover edge and the second cover edge are disposed opposite to one another.

Figure 9:
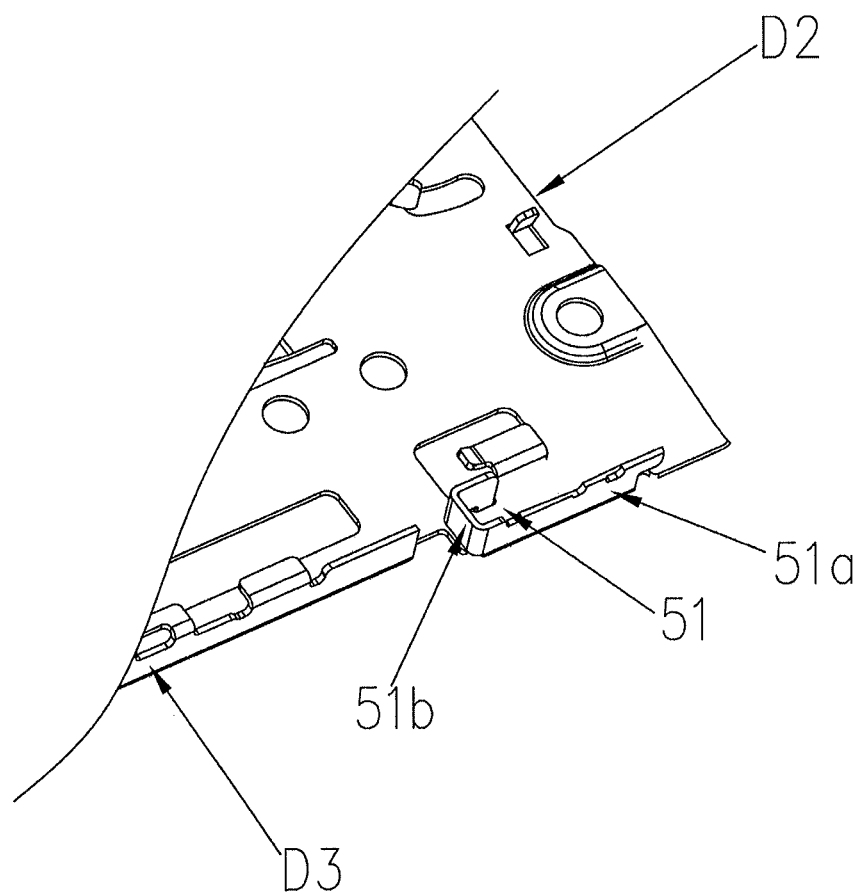
FIG. 9 illustrates a schematic diagram of a receiving portion of a card socket component in FIG. 8.

In an embodiment, as illustrated in FIG. 9, the cover 5 forms a receiving portion 51 having a side edge 51a and a bottom edge 51b adjacent to each other. The length of the side edge 51a extends in the sliding direction of the card holder 3, 6, and the bottom edge 51b forms the closed end A1. The elastic member 41 is elastically connected between the bottom edge 51b and the first end 421 of the lever 42. Specifically, a part of one third cover edge D3 of the cover 5, close to the second cover edge D2, is bent to form a side edge 51a and a bottom edge 51b, so as to form the receiving portion 51 receiving the elastic member 41. The first elastic end 41a of the elastic member 41 is fixed to the bottom edge 51b, and the second elastic end 41b of the elastic member 41 is a free end for abutting against the lever 42 mentioned hereinafter. By means of the receiving portion 51, the elastic member 41 is always retained in the receiving portion 51 when being compressed, and cannot be separated from the bearing plate 2 or cannot be ejected from the bearing plate 2 due to large elasticity, thereby improving the reliability of the card socket component 10. Of course, in other embodiments, the cover 5 may also be provided with a supporting protrusion 421, and one end of the elastic member 41 is fixed to the supporting protrusion 421a.

It should be understood that the bottom edge 51b is L-shaped, that is, the bottom edge 51b and the side edge 51a form a smaller space for better fixing the first elastic end 41a. Of course, in other embodiments, the bottom edge 51b may also be of a straight shape.

Figure 10:
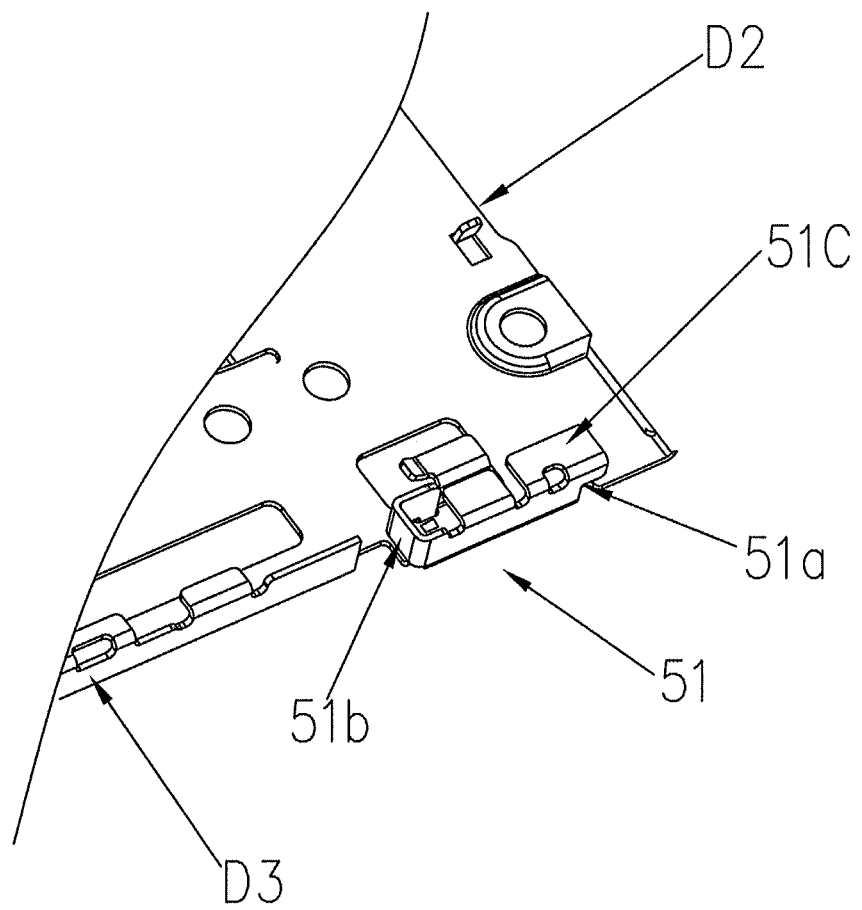
FIG. 10 illustrates a schematic diagram of another receiving portion of a card socket component in FIG. 8.

Further, as illustrated in FIG. 10, the cover 5 may also has an extending portion 51c, one end of which is connected to the side edge 51a in a bending manner, and the other end of which extends towards the bearing plate 2, such that the extending portion 51c and the side edge 51a form a space surrounding the elastic member 41. Specifically, the extending portion 51c is of a semi-arc shape, which is formed integrally with the side edge 51a. The extending portion 51c and the side edge 51a form a space surrounding the elastic member 41, thereby avoiding the elastic member 41 from being pushed out towards the extending portion 51c due to a larger external force, and improving the reliability of the card socket component 10.

Figure 11:
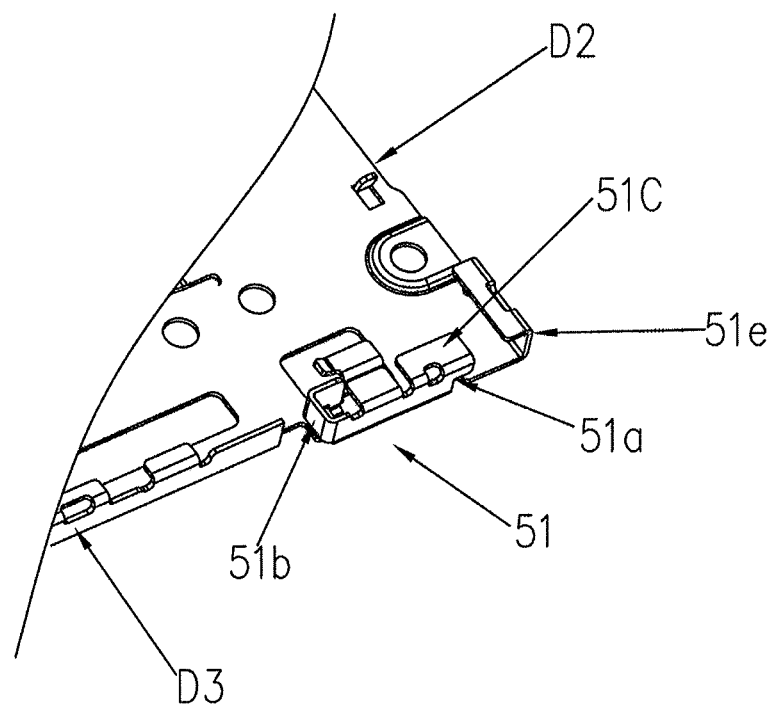
FIG. 11 illustrates a schematic diagram of yet another receiving portion of a card socket component in FIG. 8.

Further, as illustrated in FIG. 11, the receiving portion 51 may also has a flange 51e, the flange 51e and the side edge 51a are disposed opposite to one another. The first end 421 of the lever 42 is able to move between the flange 51e and the side edge 51a. Specifically, the flange 51e of the receiving portion 51 may be formed by bending the second cover edge D2, so that the elastic member 41 is further retained in a space surrounded by the side edge 51a and the flange 51e. In this way, the sliding stroke of the first end 421 of the lever 42 is limited, and interference to other devices caused by the movement of the first end 421 of the lever 42 out of the bearing plate 2 is prevented, thereby improving the reliability of the card socket component 10.

Figure 12:
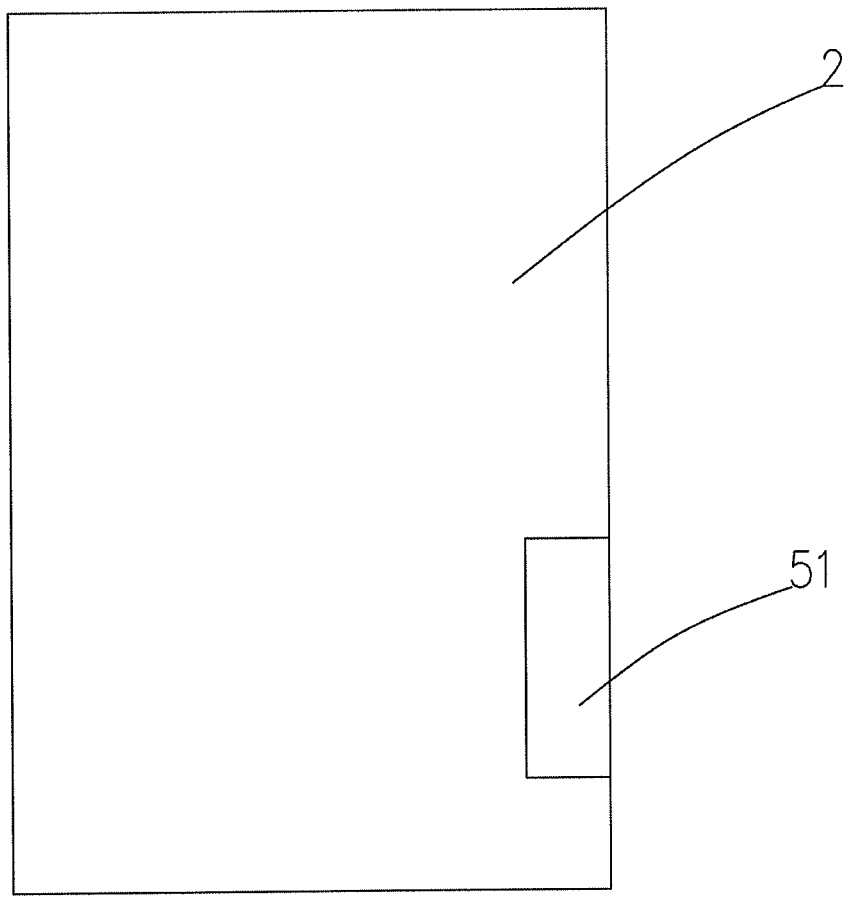
FIG. 12 illustrates a schematic diagram of a receiving portion formed by a bearing plate in FIG. 7.

As illustrated in FIG. 12, it should be understood that, the receiving portion 51 may also be formed on the bearing plate 2, and the receiving portion 51 may be the same as the structure provided on the cover 5, and the detailed description thereof will be omitted.

Figure 13:
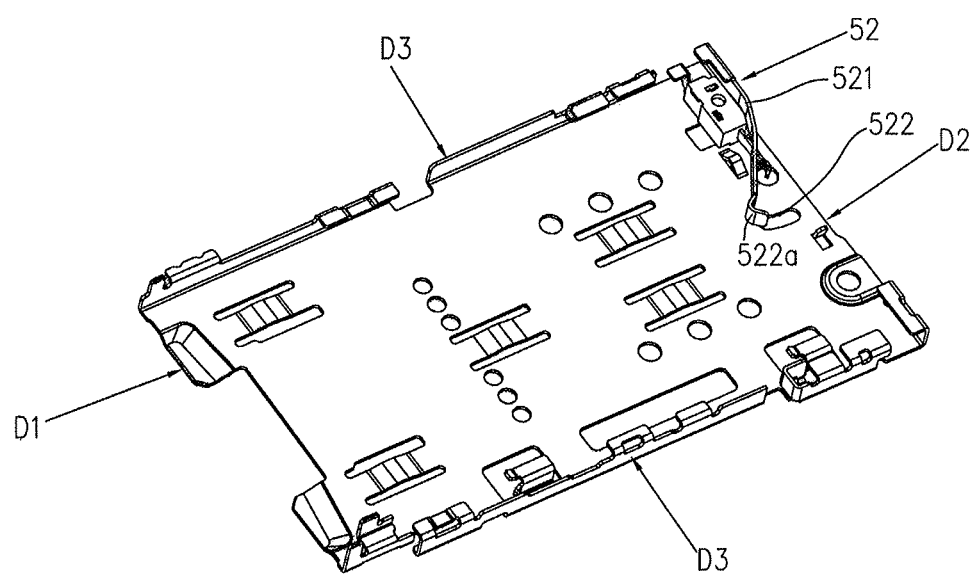
FIG. 13 illustrates a schematic diagram of another cover of a card socket component in FIG. 7.
Figure 14:
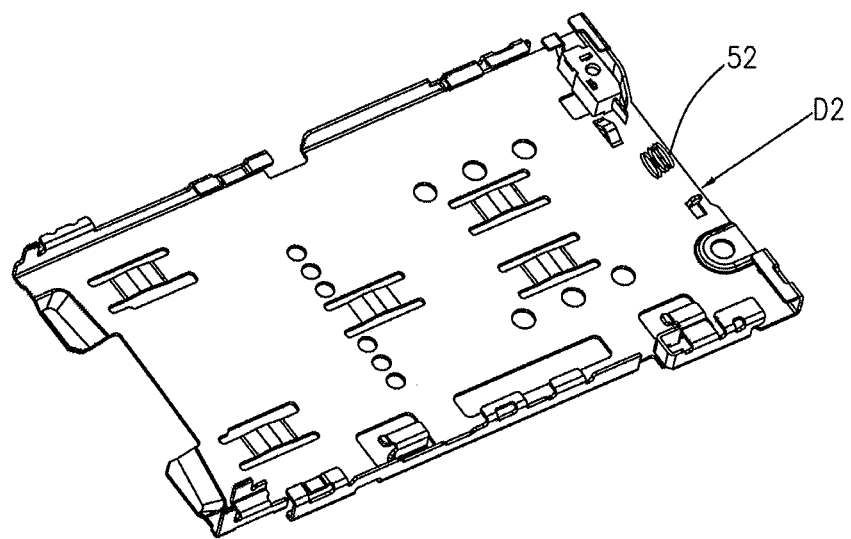
FIG. 14 illustrates a schematic diagram of yet another cover of a card socket component in FIG. 7.

Further, as illustrated in FIG. 13, the cover 5 may also has an elastic portion 52, the end of which extends towards the second end 422 of the lever 42, and the end of the elastic portion 52 can abuts against the second end 422 of the lever 42. By further providing the elastic portion 52 on the cover 5, the second end 422 of the lever 42 cloud better presses against the tray 31, 61. Of course, in other embodiments, the cover may not be provided with the elastic portion The elastic portion 52 has a first elastic segment 521 and a second elastic segment 522 connected in sequence. The first elastic segment 521 is disposed at the edge of the cover 52, and the second elastic segment 522 has a bending portion 522a. The bending portion 522a protrudes towards the second end 422 of the lever 42, and abuts against the second end 422 of the lever 42. Specifically, the first elastic segment 521 is disposed on the second cover edge D2, and the second elastic segment 522 extends gradually away from the second cover edge D2, so as to be gradually inclined towards the second end 422 of the lever 42. Of course, in other embodiments, as illustrated in FIG. 14, the elastic portion 52 may also be a spring disposed on the second cover edge D2.

As illustrated in FIG. 2 and FIG. 3, it should be understood that, the locking manner of the baffle 32, 62 of the card holder 3, 6 and the housing 1 includes, but is not limited to, the following embodiments.

In an embodiment, as illustrated in FIG. 2, FIG. 15 to FIG. 17, a protrusion 1b is disposed on a hole wall of the through hole 1a. The baffle 32 is slidably connected to the tray 31, and a groove 321b is provided in the side surface of the baffle 32. The baffle 32 is slidably disposed in the through hole 1a in a radial direction of the through hole 1a. When the baffle 32 slides to an extent that the protrusion 1b is engaged into the groove 321b of the baffle 32, the baffle 32 is locked onto the housing 1, and the baffle 32 is at a first staying position with respect to the tray 31; and when the baffle 32 slides to an extent that the protrusion 1b is separated from the groove 321b of the baffle 32, the baffle 32 is pushed out from the housing 1 under the action of the elastic force of the lever 42, and the baffle 32 is at a second staying position with respect to the tray 31.

Figure 16:
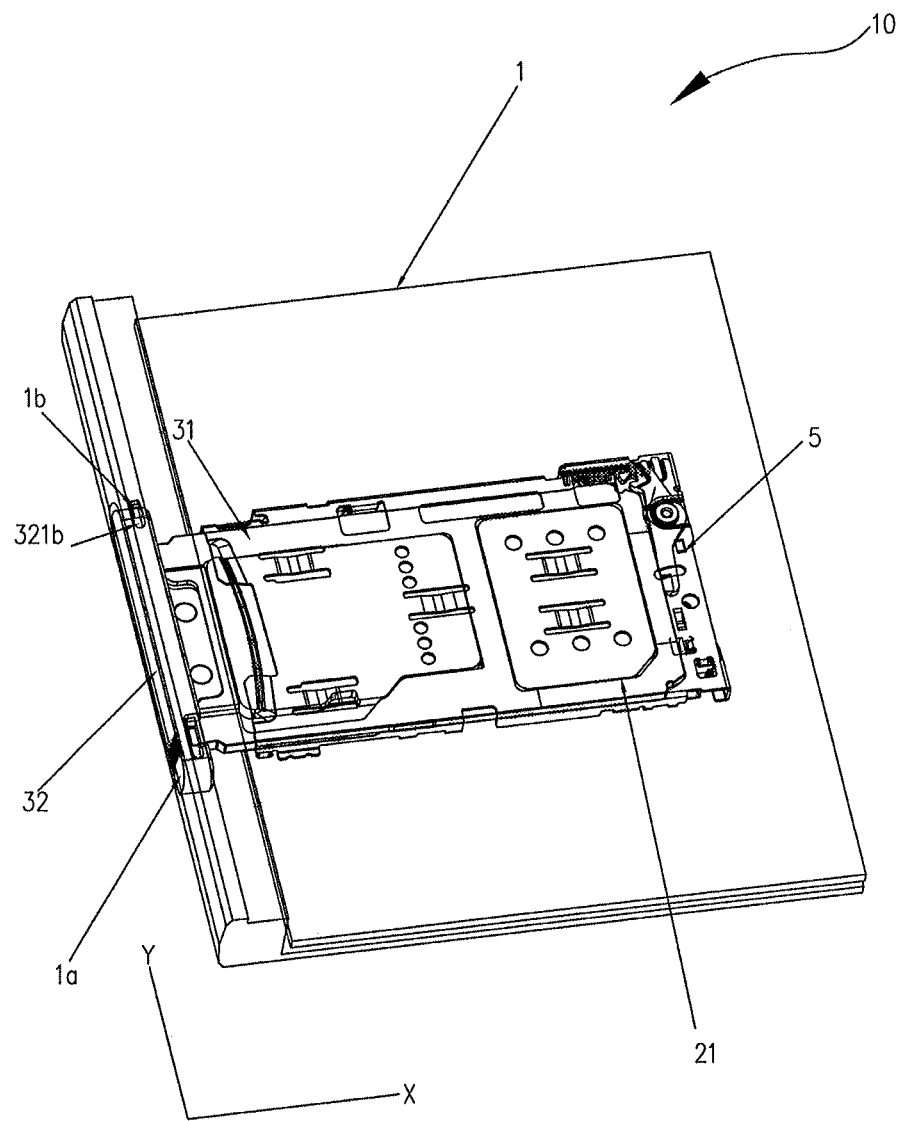
FIG. 16 illustrates a schematic diagram of a card holder in a locking state in FIG. 15.

Specifically, as illustrated in FIG. 16, the length of the through hole 1a in the radial direction (namely, the Y direction) is greater than the length of the baffle 32 in the Y direction, so that when the baffle 32 is disposed in the through hole 1a of the housing 1, a sliding space for the sliding of the baffle in the Y direction is available. A hole wall of the through hole 1a is provided with a protrusion 1b protruding from the hole wall.

Figure 17:
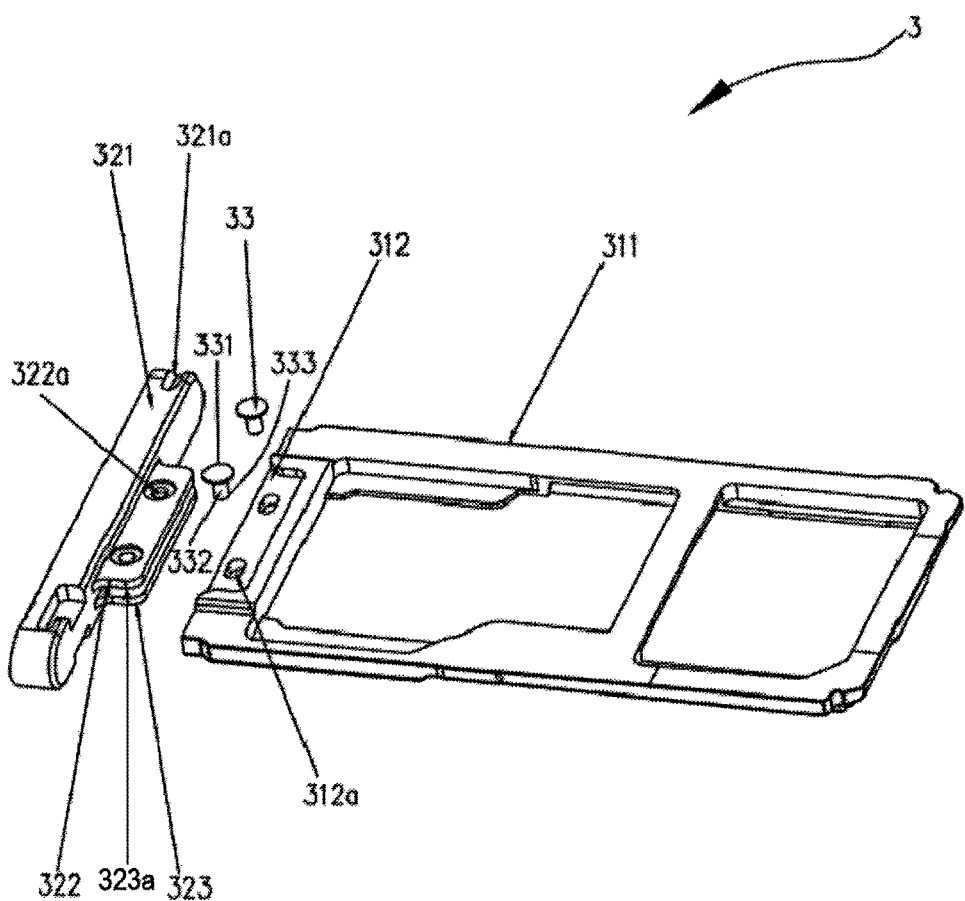
FIG. 17 illustrates an exploded view of a card holder in FIG. 15.

As illustrated in FIG. 17, the side surface of the baffle 32 is correspondingly provided with a groove 321b recessed in the side surface. When the baffle 32 slides in the Y direction and slides to approach the protrusion 1b, the groove 321b on the baffle 32 cloud be finally engaged with the protrusion 1b, so as to lock the baffle 32 onto the housing 1. When it is necessary to take out the card holder 3, the baffle 32 is poked to cause the baffle 32 to slide away from the protrusion 1b and to slide in the Y direction, so that the baffle 32 is unlocked from the housing 1. Since the second end 422 of the lever 42 always exerts an opposite elastic force on the tray 31, once the baffle 32 is unlocked, the tray 31 will be pushed out from the housing 1 due to the opposite elastic force of the second end 422 of the lever 42, so that a card cloud be taken out.

It should be understood that the baffle 32 is slidably connected to the tray 31, the baffle 32 cloud slide in the Y direction with respect to the tray 31, so as to be located at a first staying position or a second staying position correspondingly with respect to the tray 31. Even when the baffle 32 slides, the tray 31 cloud be always fixed with respect to the bearing plate 2 to make it convenient for the bearing plate 2 to read data of the information card on the tray 31.

The sliding connection structure of the baffle 32 and the tray 31 includes, but is not limited to, the following embodiments.

As illustrated in FIG. 17, the tray 31 includes a tray 31 body and a first sliding plate 312 fixed to the tray 31 body. The tray 31 body is configured to carry the information card. The baffle 32 includes a baffle body 621, and a second sliding plate 322 and a third sliding plate 323 fixedly connected to the baffle 32 body. The second sliding plate 322 and the third sliding plate 323 are slidably connected to two opposite sides of the first sliding plate 312, such that the baffle 32 is slidably connected to the tray 31 in the radial direction of the through hole 1a.

As illustrated in FIG. 17, the card socket component 10 further includes a pin 33, and a strip-shaped groove 312a is provided on the first sliding plate 312. The strip-shaped groove 312a extends in the radial direction of the through hole 1a, and at least one first through hole 322a is provided on the second sliding plate 322. The pin 33 includes a first portion 331 and a second portion 332 fixedly connected to the first portion 331. The first portion 331 is located in the first through hole 322a so as to be fixed with respect to the second sliding plate 322, and the second portion 332 is located in the strip-shaped groove 312a so as to be slidably connected with the first sliding plate 312.

The third sliding plate 323 is provided with at least one second through hole 323a coaxial with the first through hole 322a. The pin 33 further includes a third portion 333, the third portion 333 is connected to a side of the second portion 332 away from the first portion 331, and the third portion 333 is located in the second through hole 323a.

Figure 15:
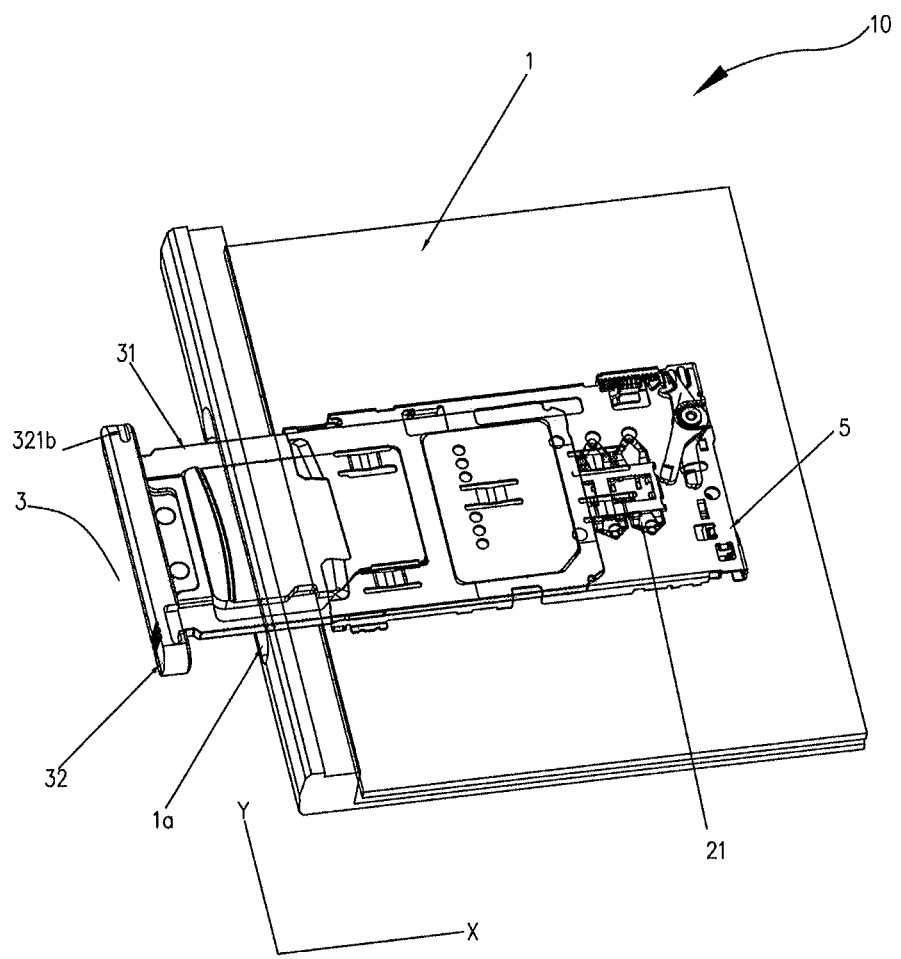
FIG. 15 illustrates a schematic diagram of a card holder in an unlocking state in an embodiment.

As illustrated in FIG. 15, when it is necessary to lock the card socket component 10, the baffle 32 is poked to cause the baffle 32 to slide in the Y direction and approach the protrusion 1b, so that the groove 321b on the baffle 32 cloud be finally engaged with the protrusion 1b, so as to lock the baffle 32 onto the housing 1.

As illustrated in FIG. 3 and FIG. 16, when it is necessary to unlock the card socket component 10, the baffle 32 is poked to cause the baffle 32 to slide away from the protrusion 1b and slide in the Y direction, so that the baffle 32 is unlocked from the housing 1. Since the second end 422 of the lever 42 always exerts an opposite elastic force on the tray 31, once the baffle 32 is unlocked, the tray 31 will be pushed out from the housing 1 due to the opposite elastic force of the second end 422 of the lever 42, so that a card cloud be taken out.

The locking structure of the baffle 32 of the card holder 3 and the housing 1 realizes locking and unlocking of the card holder 3 by poking the baffle 32 to slide in the Y direction to make the baffle 32 and the housing 1 engaged or disengaged. As such, an additional tool is not needed, and the card is convenient to take out.

Figure 18:
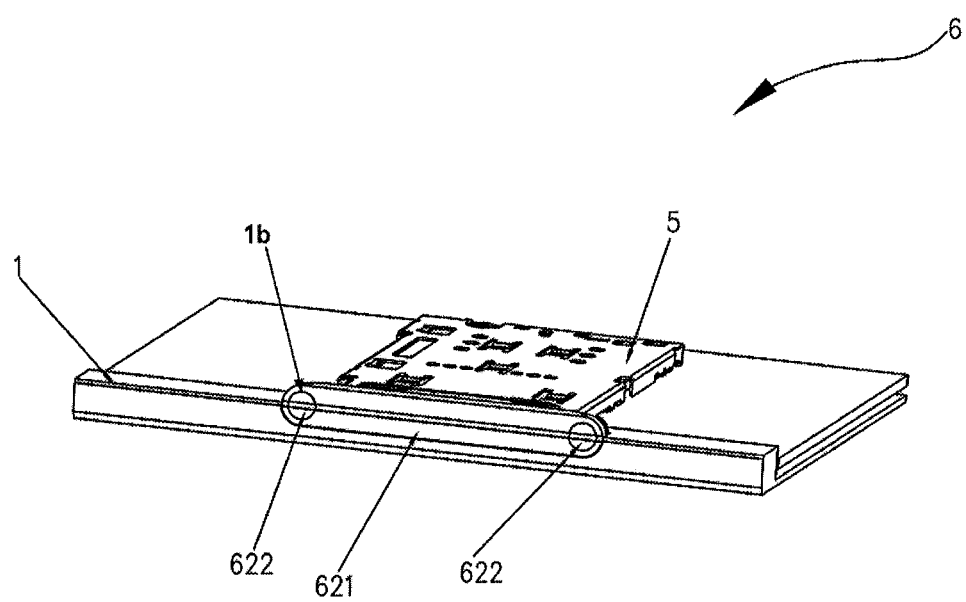
FIG. 18 illustrates a schematic diagram of a card holder in a locking state in another embodiment.
Figure 19:
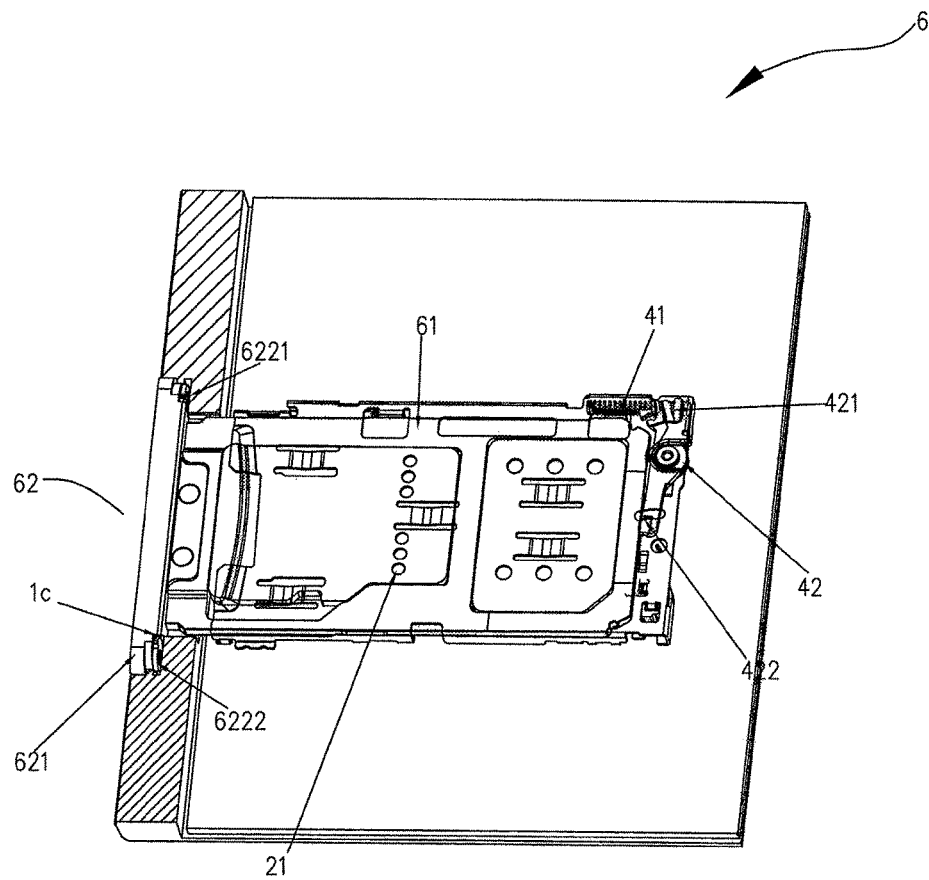
FIG. 19 illustrates a section view of a card holder in a locking state in FIG. 18.
Figure 20:
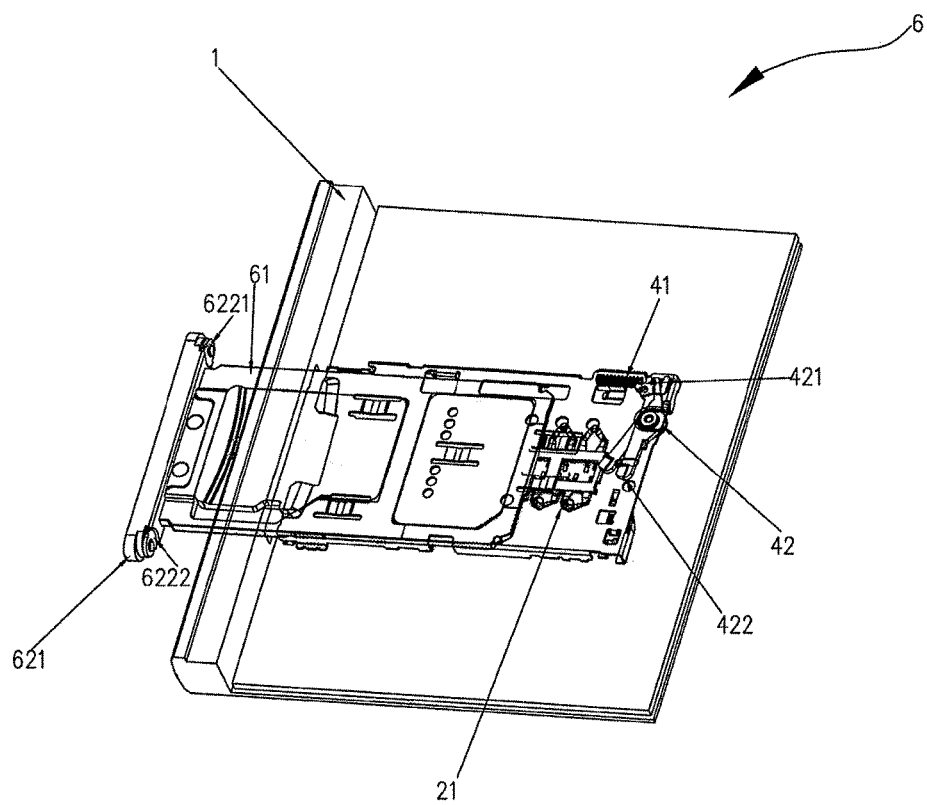
FIG. 20 illustrates a schematic diagram of a card holder in an unlocking state in FIG. 18.

In another embodiment, as illustrated in FIG. 18 to FIG. 20, the hole wall of the through hole 1a is provided with a locking slot 1c, and the baffle 62 includes a baffle body 621 and at least one locking member 622 rotatably connected to the baffle body 621. The baffle body 621 is connected to the tray 61, and has at least one locking hole 1d. The locking member 622 is received in the locking hole 1d of the baffle body 621, and the locking member 622 has a limiting protrusion 6222. When the locking member 622 rotates to locate the limiting protrusion 6222 of the locking member 622 in the locking slot 1c, the baffle body 621 is locked onto the housing 1; and when the locking member 622 rotates to cause the limiting protrusion 6222 of the locking member 622 to be separated from the locking slot 1c, the baffle body 621 is pushed out from the housing 1 under the action of the elastic force of the lever 42.

Specifically, as illustrated in FIG. 19, the size of the through hole 1a corresponds to the size of the baffle body 621, and when the baffle body 621 is located in the through hole 1a, the baffle body 621 can cover the opening of the through hole 1a. The locking slot 1c is recessed in the hole wall of the through hole 1a.

The locking member 622 passes through the locking hole 1d of the baffle body 621, and the locking member 622 is rotatable in the locking hole 1d. When the locking member 622 rotates to an extent that the limiting protrusion 6222 is located in the locking slot 1c, the baffle body 621 is locked on the housing 1; and when the locking member 622 rotates to an extent that the limiting protrusion 6222 is separated from the locking slot 1c, the baffle body 621 is unlocked from the housing 1. Since the second end 422 of the lever 42 always exerts an opposite elastic force on the tray 61, once the baffle 32, 62 is unlocked, the tray 61 will be pushed out from the housing 1 due to the opposite elastic force of the second end 422 of the lever 42, so that a card cloud be taken out.

As illustrated in FIG. 18 to FIG. 20, it should be understood that the locking member 622 includes a rotary pin 6221 and a lock piece 6222. The rotary pin 6221 is located in the locking hole 1d of the baffle body 621 and extends out of the baffle body 621, and the lock piece 6222 is mounted around the rotary pin 6221, so that the lock piece 6222 forms the limiting protrusion 6222 of the locking member 622.

Specifically, the end of the rotary pin 6221 is flush with the outer surface of the baffle body 621, so as to improve the smoothness of the outer surface of the housing 1.

It should be understood that the baffle body 621 and the tray 61 may be fixedly connected. Of course, in other embodiments, the baffle body 621 may also be hinged to the tray 61.

As illustrated in FIG. 18, when it is necessary to lock the card socket component 10, the rotary pin 6221 rotates until the limiting protrusion 6222 is located in the locking slot 1c by means of the rotation of the rotary pin 6221, so that the baffle 62 is locked on the housing 1.

As illustrated in FIG. 20, when it is necessary to unlock the card socket component 10, the rotary pin 6221 rotates until the limiting protrusion 6222 is separated from the locking slot 1c by means of the rotation of the rotary pin 6221, so that the baffle body 621 is unlocked from the housing 1. Since the second end 422 of the lever 42 always exerts an opposite elastic force on the tray 61, once the baffle 32, 62 is unlocked, the tray 61 will be pushed out from the housing 1 due to the opposite elastic force of the second end 422 of the lever 42, so that a card cloud be taken out.

When it is necessary to load the information card into the electronic device 100 provided by the embodiment of the present disclosure, the information card is loaded on the tray 61 at first; then, the tray 61 slides into the housing 1 via the through hole 1a of the housing 1, and the information card on the tray 61 abuts against the elastic piece 21 on the bearing plate 2, in order that the bearing plate 2 reads data on the information card; after the tray 61 slides and reach a maximum stroke, the baffle 32, 62 is locked with respect to the housing, in this case, the second end 422 of the lever 42 always provides the opposite elastic force to the tray 61, and the tray 61 will be ejected from the housing 1 under the action of the opposite elastic force of the second end 422 as long as the locking force between the baffle 32, 62 and the housing is released, and then the card cloud be taken out.

When it is necessary to take out the information card from the electronic device 100 provided by the embodiment of the present disclosure, the baffle 32, 62 is poked to unlock the baffle 32, 62 with respect to the housing, so the tray 61 will be ejected from the housing 1 under the action of the opposite elastic force of the second end 422, and the card cloud be taken out.

According to the card socket component 10 and the electronic device 100 provided by the embodiment of the present disclosure, the baffle 32, 62 of the card holder 3, 6 is locked onto the housing 1, and the baffle 32, 62 cloud be unlocked from the housing 1 by poking the baffle 32, 62. Moreover, the second end 422 of the lever 42 always provides an elastic force for pushing out the card holder 3, 6 from the housing 1, such that when the baffle 32, 62 and the housing 1 are in an unlocking state, the baffle 32, 62 will be pushed out by the second end 422 of the lever 42, so as to provide a card socket component 10 and an electronic device 100 that facilitate the taking-out of the card.

The above is the preferred embodiment of the present disclosure. It should be pointed out that those of ordinary skill in the art may also make several improvements and modifications without departing from the principle of the present disclosure. These improvements and modifications fall within the scope of protection of the present disclosure.

The invention claimed is:

1. A card socket component for an electronic device, comprising a housing, a bearing plate fixed in the housing, a card holder and an elastic component, the housing having a through hole, the card holder having a tray and a baffle connected to the tray, the tray passing through the through hole of the housing and being slidably connected to the bearing plate, the elastic component comprising an elastic member and a lever, the elastic member being elastically disposed on the bearing plate in a sliding direction of the card holder, the lever being rotatably connected to the bearing plate, a first end of the lever abutting against the elastic member, and a second end of the lever can abutting against the tray; when the baffle of the card holder is locked onto the housing, the second end of the lever provides an opposite elastic force for the card holder; and after the baffle is poked by an external force, the baffle is unlocked from the housing and is pushed out from the housing under an action of the second end of the lever.

2. The card socket component according to claim 1, wherein the card socket component is formed with a receiving portion having a closed end, an open end, and a cavity communicated with the open end, the closed end and the open end being disposed opposite to one another, one end of the elastic member being fixedly disposed on the closed end, the other end of the elastic member extending towards the open end, and the first end of the lever extending into the open end and abutting against the other end of the elastic member.

3. The card socket component according to claim 2, wherein the receiving portion has a side edge and a bottom edge adjacent to each other, the length of the side edge extending in the sliding direction of the card holder, the bottom edge forming the closed end of the receiving portion, and the elastic member being elastically connected between the bottom edge and the first end of the lever.

4. The card socket component according to claim 1, wherein the first end of the lever has a first surface and a second surface adjacent to each other, the first surface abutting against the elastic member, and the second surface facing towards a periphery face of the elastic member; and the first surface of the lever is further provided with a positioning protrusion protruding from the first surface, the elastic member being mounted around the positioning protrusion.

5. The card socket component according to claim 1, wherein a hole wall of the through hole is provided with a protrusion, the baffle being slidably connected to the tray, a side surface of the baffle being provided with a groove, the baffle being slidably disposed in the through hole in a radial direction of the through hole; when the baffle slides to an extent that the protrusion is engaged into the groove of the baffle, the baffle is locked onto the housing and is located at a first staying position with respect to the tray; and when the baffle slides to an extent that the protrusion is separated from the groove of the baffle, the baffle is pushed out from the housing under the action of the elastic force of the lever and is located at a second staying position with respect to the tray.

6. The card socket component according to claim 5, wherein the tray comprises a tray body and a first sliding plate fixed to the tray body, the tray body being configured to carry an information card, the baffle comprising a baffle body, and a second sliding plate and a third sliding plate which are fixedly connected to the baffle body, the second sliding plate and the third sliding plate being slidably connected to two opposite sides of the first sliding plate so as to slidably connect the baffle to the tray in the radial direction of the through hole.

7. The card socket component according to claim 6, further comprising a pin, wherein the first sliding plate is provided with a strip-shaped groove extending in the radial direction of the through hole, the second sliding plate being provided with a first through hole, the pin comprising a first portion and a second portion fixedly connected to the first portion, the first portion being located in the first through hole so as to be fixed with respect to the second sliding plate, and the second portion being located in the strip-shaped groove so as to be slidably connected to the first sliding plate.

8. The card socket component according to claim 1, wherein a hole wall of the through hole is provided with a locking slot, the baffle comprising a baffle body and at least one locking member rotatably connected to the baffle body, the baffle body being connected to the tray and having at least one locking hole, the locking member being received in the locking hole of the baffle body, and the locking member having a limiting protrusion; when the locking member rotates to locate the limiting protrusion of the locking member in the locking slot, the baffle body is locked onto the housing; and when the locking member rotates to make the limiting protrusion of the locking member separated from the locking slot, the baffle body is pushed out from the housing under the action of the elastic force of the lever.

9. The card socket component according to claim 8, wherein the locking member comprises a rotary pin and a lock piece, the rotary pin being located in the locking hole of the baffle body and extending out of the baffle body, and the lock piece being mounted around the rotary pin in such a way that the lock piece forms the limiting protrusion of the locking member.

10. An electronic device, comprising a motherboard and a card socket component, the card socket component comprises a housing, a bearing plate fixed in the housing, a card holder and an elastic component, the housing having a through hole, the card holder having a tray and a baffle connected to the tray, the tray passing through the through hole of the housing and being slidably connected to the bearing plate, the elastic component comprising an elastic member and a lever, the elastic member being elastically disposed on the bearing plate in a sliding direction of the card holder, the lever being rotatably connected to the bearing plate, a first end of the lever abutting against the elastic member, and a second end of the lever can abutting against the tray; when the baffle of the card holder is locked onto the housing, the second end of the lever provides an opposite elastic force for the card holder; and after the baffle is poked by an external force, the baffle is unlocked from the housing and is pushed out from the housing under the action of the second end of the lever, the bearing plate is electrically connected to the motherboard.

11. The electronic device according to claim 10, wherein the card socket component is formed with a receiving portion having a closed end, an open end, and a cavity communicated with the open end, the closed end and the open end being disposed opposite to one another, one end of the elastic member being fixedly disposed on the closed end, the other end of the elastic member extending towards the open end, and the first end of the lever extending into the open end and abutting against the other end of the elastic member.

12. The electronic device according to claim 11, wherein the receiving portion has a side edge and a bottom edge adjacent to each other, the length of the side edge extending in the sliding direction of the card holder, the bottom edge forming the closed end of the receiving portion, and the elastic member being elastically connected between the bottom edge and the first end of the lever.

13. The electronic device according to claim 10, wherein the first end of the lever has a first surface and a second surface adjacent to each other, the first surface abutting against the elastic member, and the second surface facing towards a periphery face of the elastic member; and the first surface of the lever is further provided with a positioning protrusion protruding from the first surface, the elastic member being mounted around the positioning protrusion.

14. The electronic device according to claim 10, wherein a hole wall of the through hole is provided with a protrusion, the baffle being slidably connected to the tray, a side surface of the baffle being provided with a groove, the baffle being slidably disposed in the through hole in a radial direction of the through hole; when the baffle slides to an extent that the protrusion is engaged into the groove of the baffle, the baffle is locked onto the housing and is located at a first staying position with respect to the tray; and when the baffle slides to an extent that the protrusion is separated from the groove of the baffle, the baffle is pushed out from the housing under the action of the elastic force of the lever and is located at a second staying position with respect to the tray.

15. The electronic device according to claim 14, wherein the tray comprises a tray body and a first sliding plate fixed to the tray body, the tray body being configured to carry an information card, the baffle comprising a baffle body, and a second sliding plate and a third sliding plate which are fixedly connected to the baffle body, the second sliding plate and the third sliding plate being slidably connected to two opposite sides of the first sliding plate so as to slidably connect the baffle to the tray in the radial direction of the through hole.

16. The electronic device according to claim 15, further comprising a pin, wherein the first sliding plate is provided with a strip-shaped groove extending in the radial direction of the through hole, the second sliding plate being provided with a first through hole, the pin comprising a first portion and a second portion fixedly connected to the first portion, the first portion being located in the first through hole so as to be fixed with respect to the second sliding plate, and the second portion being located in the strip-shaped groove so as to be slidably connected to the first sliding plate.

17. The electronic device according to claim 10, wherein a hole wall of the through hole is provided with a locking slot, the baffle comprising a baffle body and at least one locking member rotatably connected to the baffle body, the baffle body being connected to the tray and having at least one locking hole, the locking member being received in the locking hole of the baffle body, and the locking member having a limiting protrusion; when the locking member rotates to locate the limiting protrusion of the locking member in the locking slot, the baffle body is locked onto the housing; and when the locking member rotates to make the limiting protrusion of the locking member separated from the locking slot, the baffle body is pushed out from the housing under the action of the elastic force of the lever.

18. The electronic device according to claim 17, wherein the locking member comprises a rotary pin and a lock piece, the rotary pin being located in the locking hole of the baffle body and extending out of the baffle body, and the lock piece being mounted around the rotary pin in such a way that the lock piece forms the limiting protrusion of the locking member.

19. An electronic device, comprising a motherboard and a card socket component, the card socket component comprising:
a housing having a through hole;
a bearing plate fixed in the housing and electrically connected to the motherboard;
a card holder having a tray and a baffle connected to the tray, the tray passing through the through hole of the housing and being slidably connected to the bearing plate; and
an elastic component comprising an elastic member and a lever, the lever being rotatably connected to the bearing plate, a first end of the lever abutting against the elastic member, and a second end of the lever abutting against the tray, the second end of the lever always providing an opposite elastic force for the card holder under the action of the elastic member,
the card socket component has a locking position in which the baffle of the card holder is locked onto the housing, and a unlocking position in which the baffle is unlocked from the housing and is pushed out from the housing under the action of the second end of the lever.

20. The electronic device according to claim 19, wherein a hole wall of the through hole is provided with a locking slot, the baffle comprising a baffle body and at least one locking member rotatably connected to the baffle body, the baffle body being connected to the tray and having at least one locking hole, the locking member being received in the locking hole of the baffle body, and the locking member having a limiting protrusion; in the locking position, the limiting protrusion of the locking member is located in the locking slot to lock the baffle body onto the housing; and in the unlocking position, the limiting protrusion of the locking member is separated from the locking slot to unlock the baffle body from the housing.

* * * * *